(12) United States Patent
Kobayashi et al.

(10) Patent No.: US 11,508,047 B2
(45) Date of Patent: Nov. 22, 2022

(54) CHARGED PARTICLE MICROSCOPE DEVICE AND WIDE-FIELD IMAGE GENERATION METHOD

(71) Applicant: HITACHI HIGH-TECH CORPORATION, Tokyo (JP)

(72) Inventors: Mitsutoshi Kobayashi, Tokyo (JP); Maki Tanaka, Tokyo (JP); Yoshinobu Hoshino, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 423 days.

(21) Appl. No.: 16/639,701

(22) PCT Filed: Sep. 14, 2017

(86) PCT No.: PCT/JP2017/033262
§ 371 (c)(1),
(2) Date: Feb. 17, 2020

(87) PCT Pub. No.: WO2019/053839
PCT Pub. Date: Mar. 21, 2019

(65) Prior Publication Data
US 2020/0265568 A1 Aug. 20, 2020

(51) Int. Cl.
*G06T 5/50* (2006.01)
*G06T 7/30* (2017.01)
(Continued)

(52) U.S. Cl.
CPC .......... *G06T 5/50* (2013.01); *G02B 21/0036* (2013.01); *G06T 3/0018* (2013.01); *G06T 7/30* (2017.01); *H01J 37/222* (2013.01)

(58) Field of Classification Search
None
See application file for complete search history.

(56) References Cited

U.S. PATENT DOCUMENTS

2013/0063585 A1* 3/2013 Watanabe ............ G02B 21/16
348/79
2013/0162803 A1* 6/2013 Steckhan ............ G06T 3/4038
348/79

FOREIGN PATENT DOCUMENTS

JP  2013058124 A  3/2013

* cited by examiner

*Primary Examiner* — Yanna Wu
(74) *Attorney, Agent, or Firm* — Miles & Stockbridge, P.C.

(57) ABSTRACT

Even if a generated wide-field image includes residual local misalignment, this charged particle microscope device can prompt for user input to correct such local misalignment, and can regenerate, on the basis of the user input, a wide-field image that includes little misalignment even in local areas of the overlap regions thereof. A charged particle microscope according to the present invention captures a plurality of images in such a way that each captured image has overlap regions that are to be overlapped with the overlap regions of captured images adjacent to that captured image, wherein an image processing unit: sets a pair of corresponding points in respective overlap regions of each two adjacent captured images; sets predetermined constraint conditions for each captured image; calculates the amounts of misalignment between the plurality of captured images on the basis of the set pairs of corresponding points and the set constraint conditions; connects the plurality of captured images to one another after correcting the misalignment between these captured images on the basis of the calculated amounts of misalignment, thereby generating a single wide-field image; calculates, for each of a plurality of local areas set in the overlap regions of each two adjacent captured images, a degree of reliability for the connection between these captured images; and notifies a user of either each found low reliability local area or the overlap region includ- (Continued)

ing that low reliability local area, as well as the set pairs of corresponding points and the set constraint conditions.

20 Claims, 18 Drawing Sheets

(51) Int. Cl.
    *G02B 21/00*     (2006.01)
    *G06T 3/00*     (2006.01)
    *H01J 37/22*     (2006.01)

[FIG. 1]
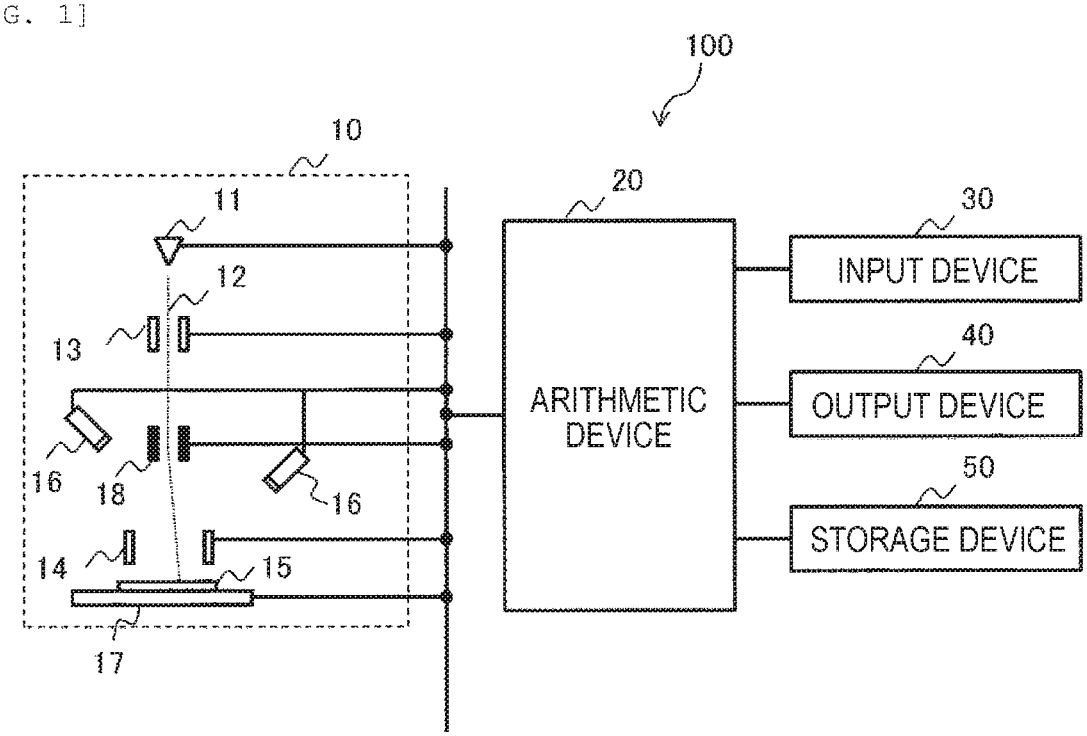

[FIG. 2]
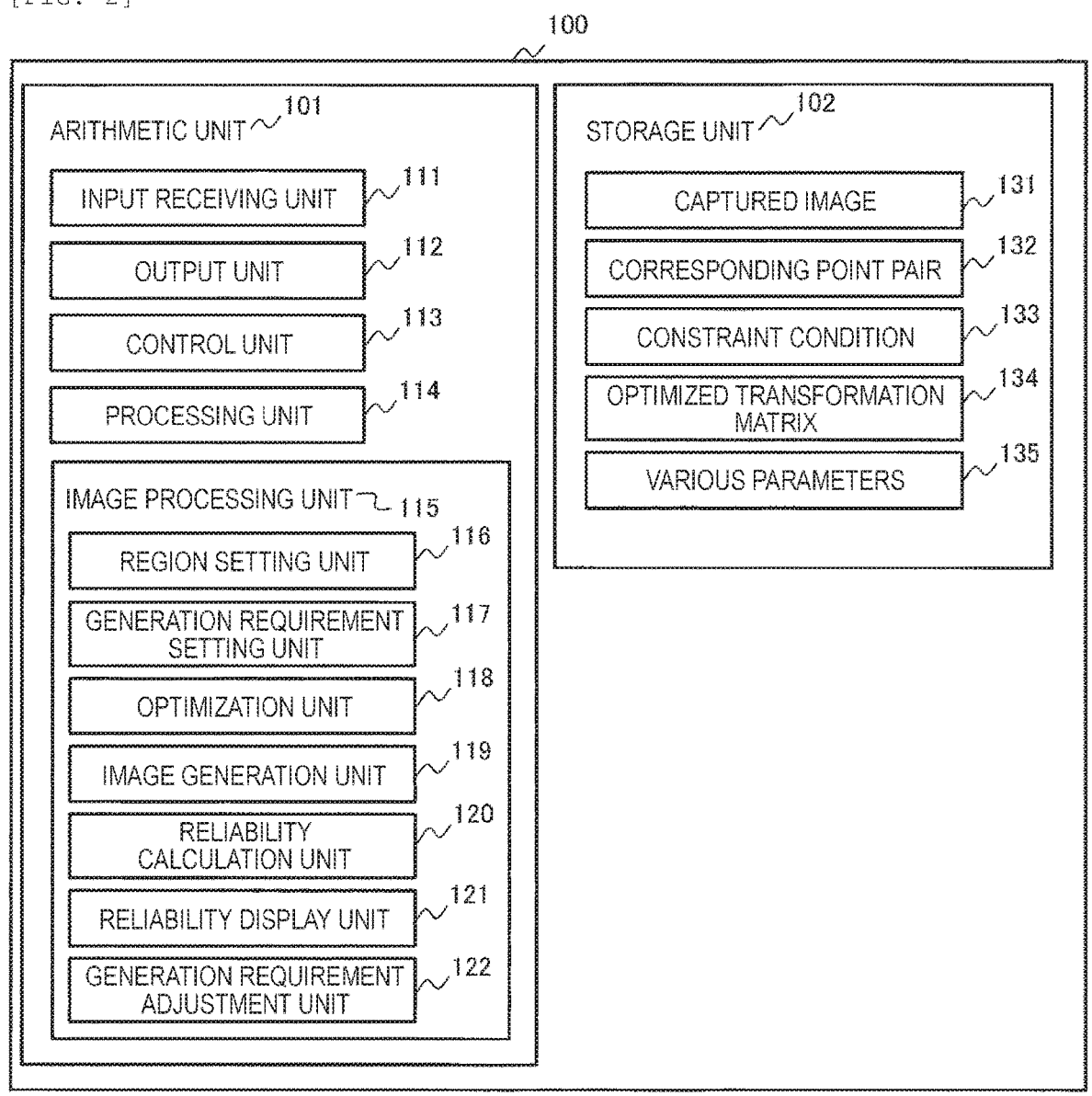

[FIG. 3]
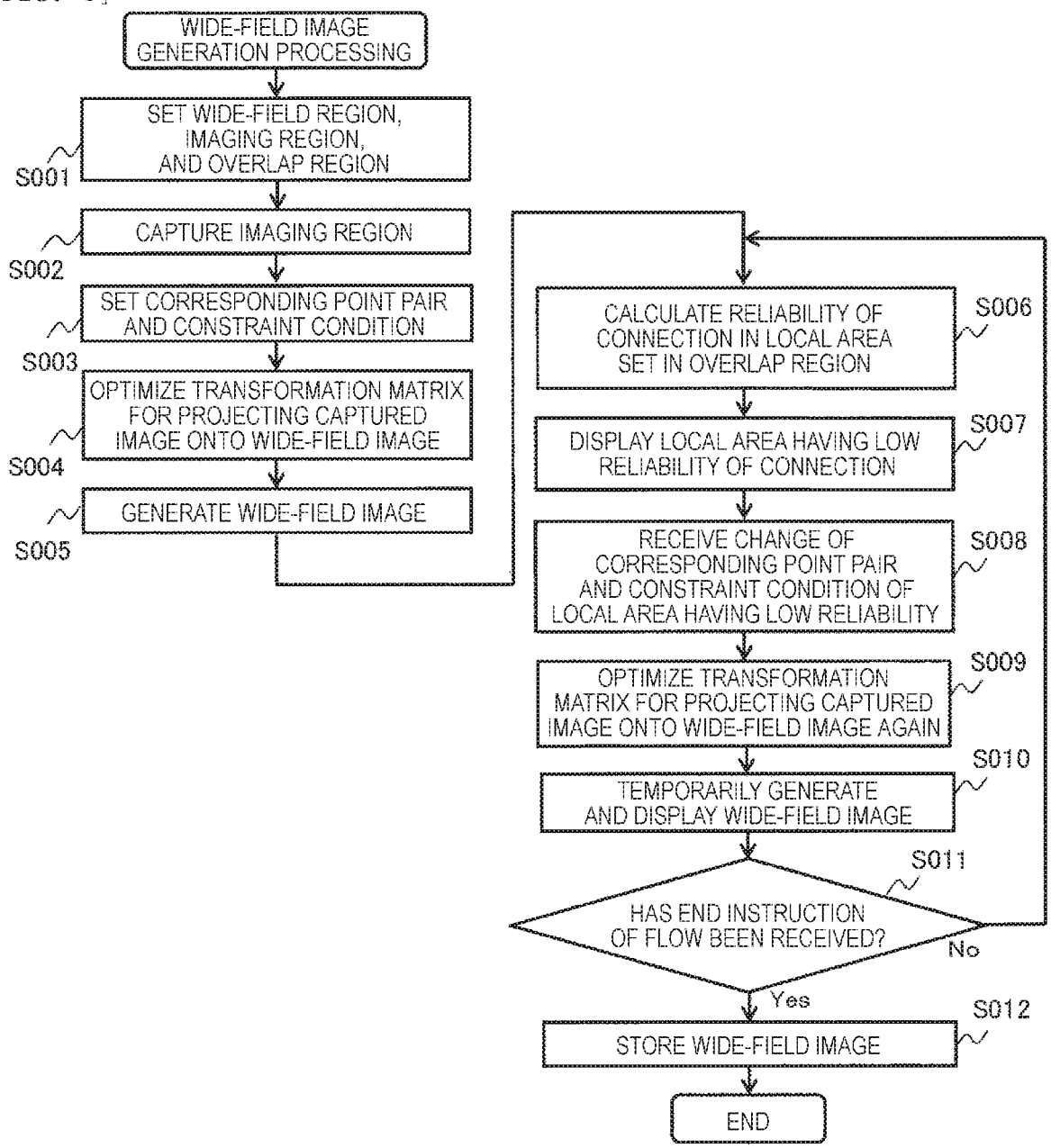

[FIG. 4A]
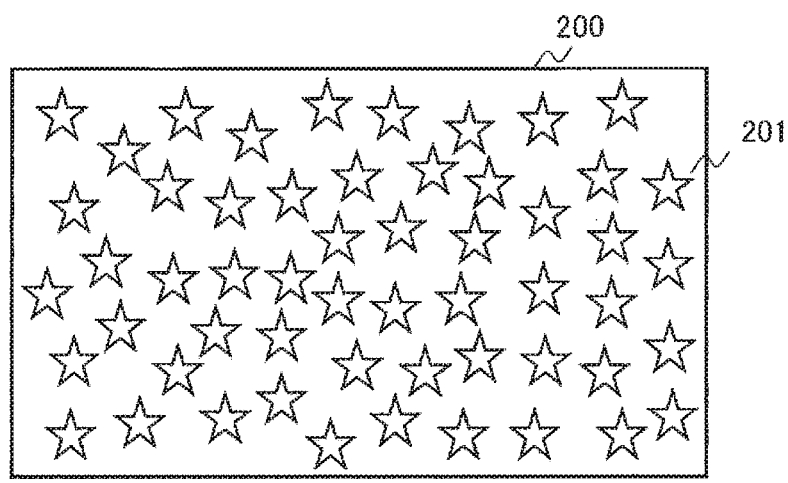
[FIG. 4B]
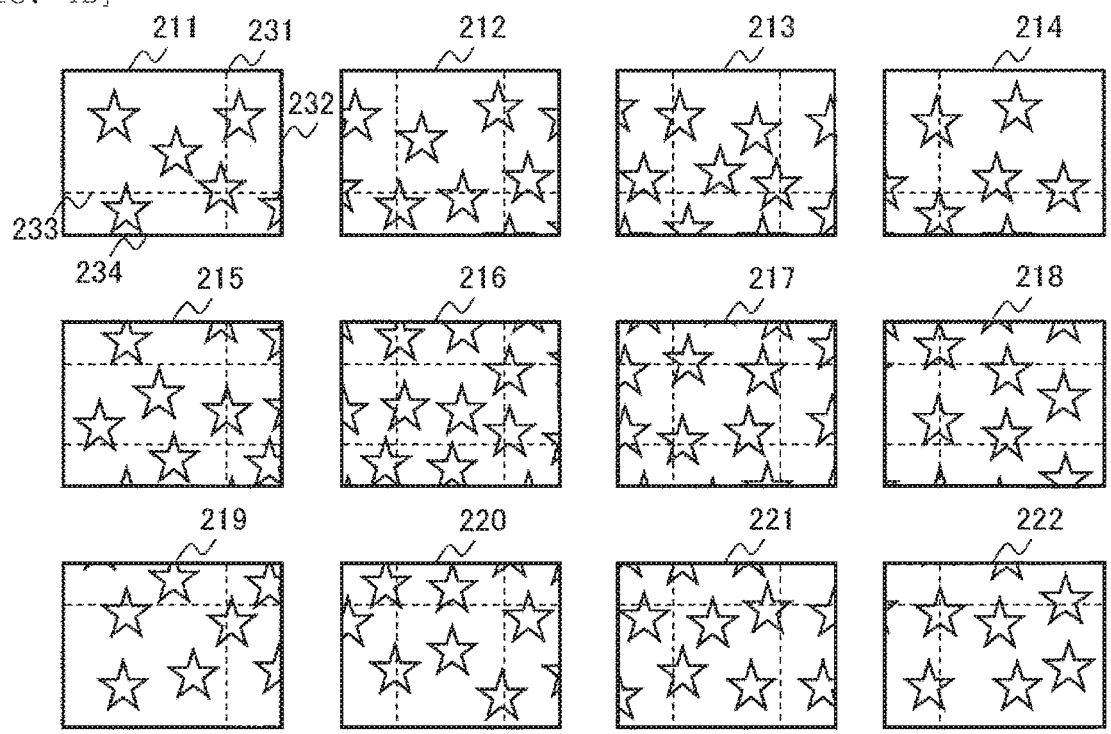

[FIG. 5]
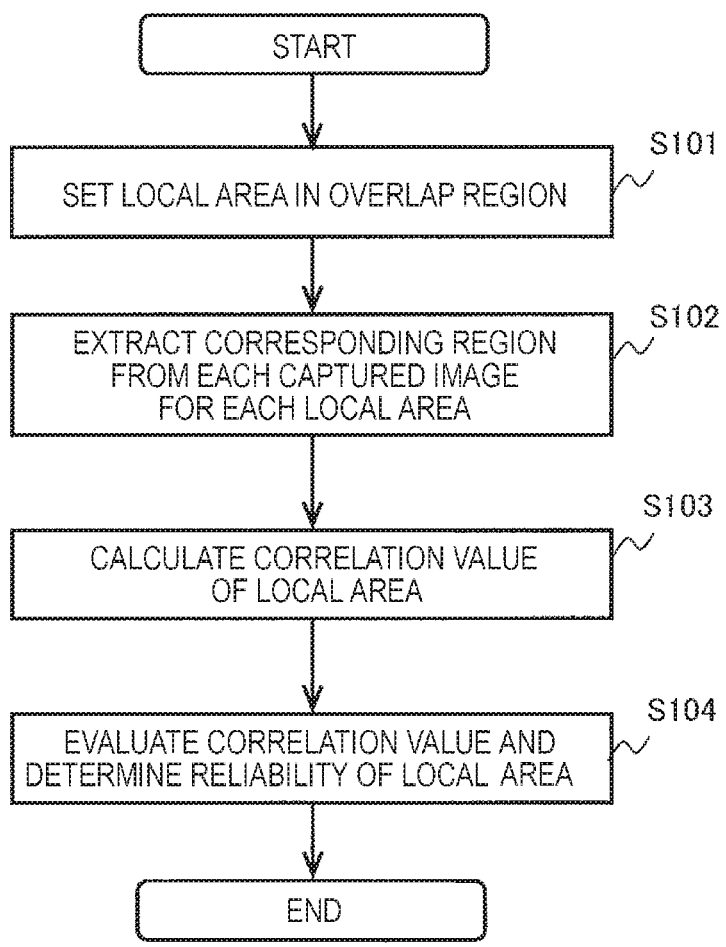

[FIG. 6A]
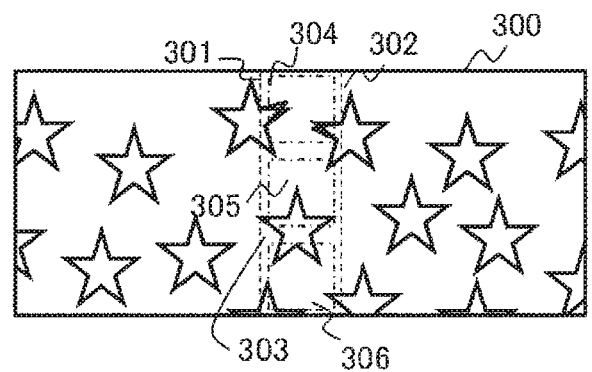
[FIG. 6B]
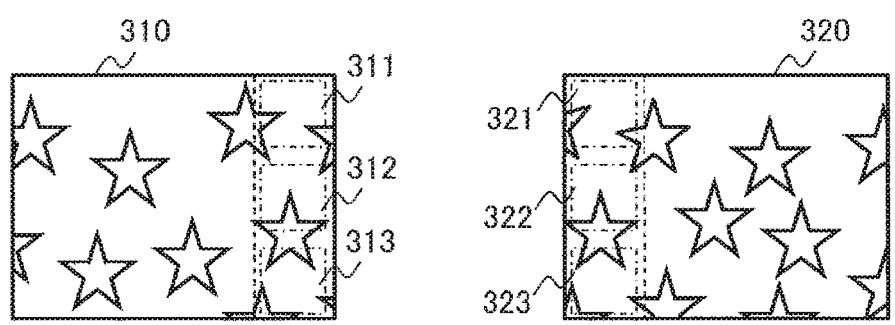
[FIG. 6C]
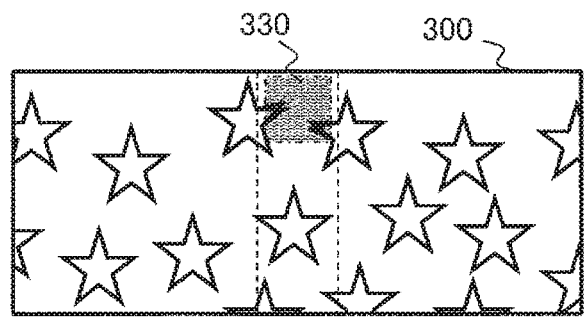

[FIG. 7]
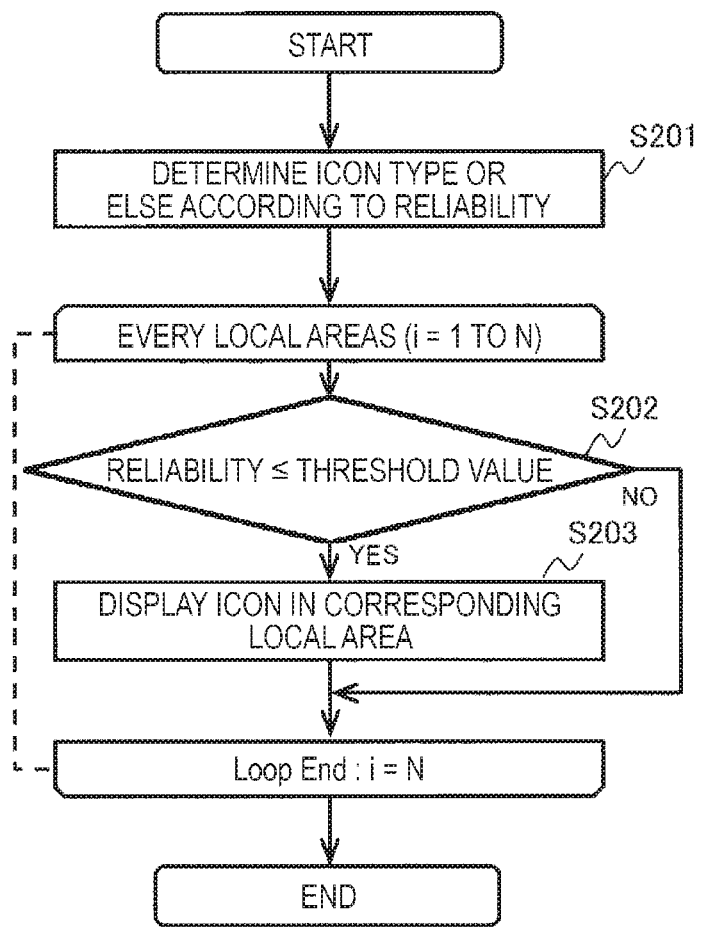

[FIG. 8A]
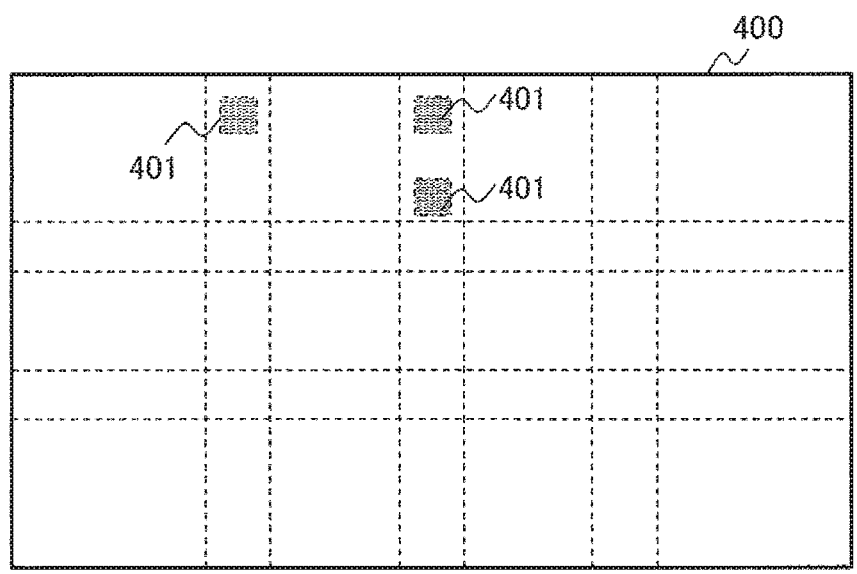
[FIG. 8B]
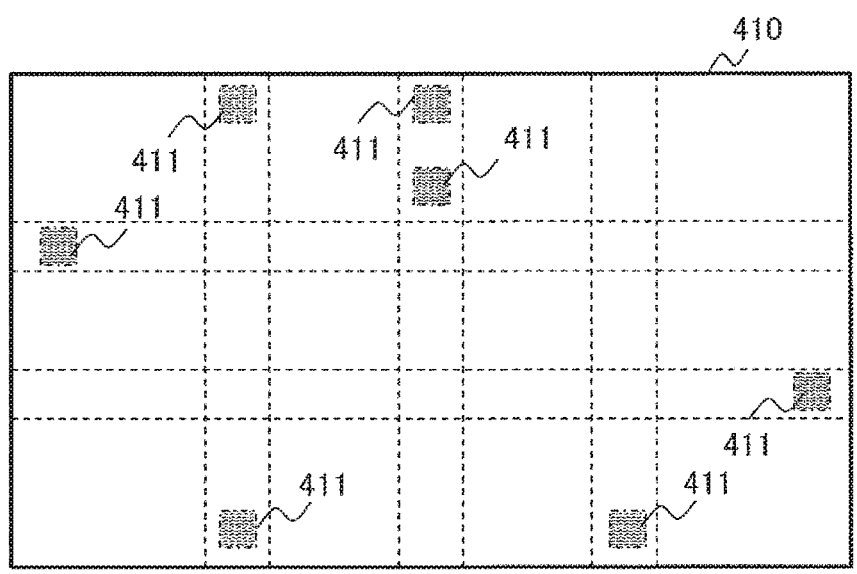

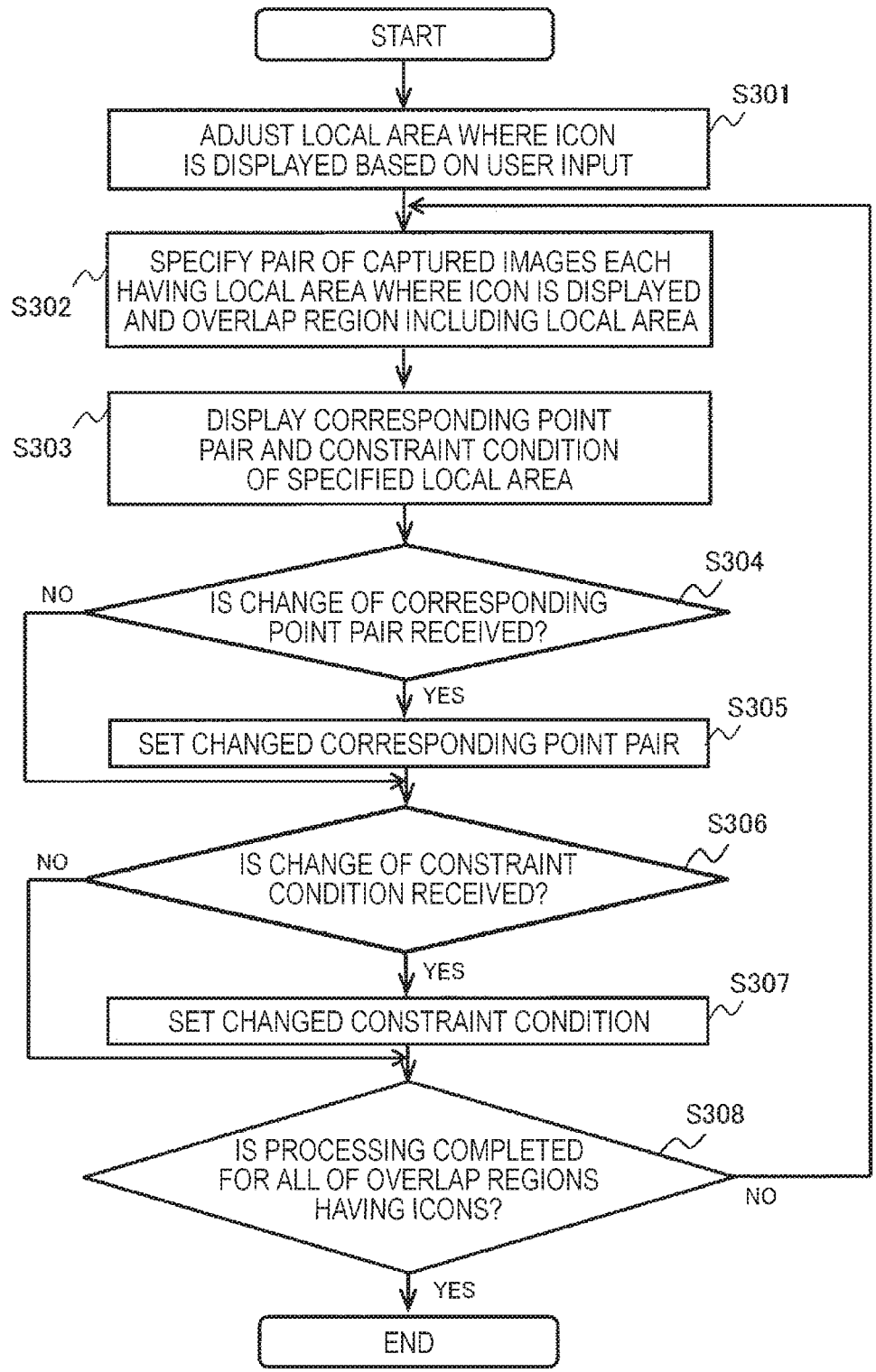

[FIG. 10A]
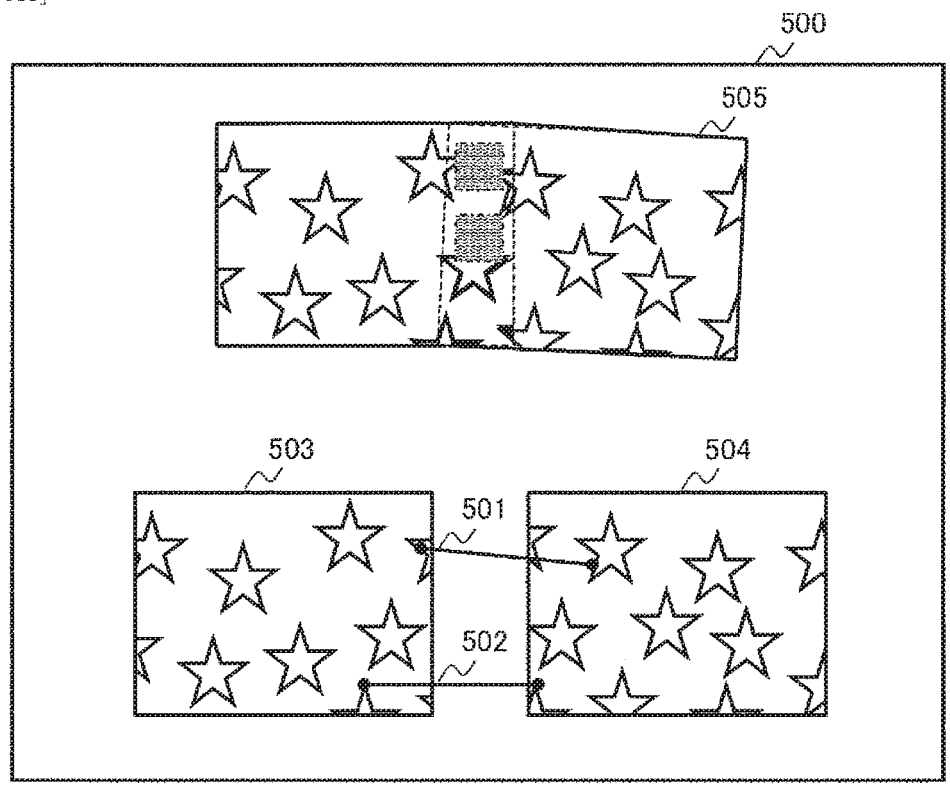
[FIG. 10B]
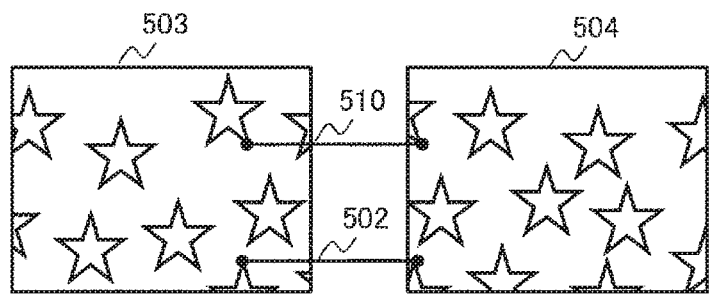

[FIG. 11A]
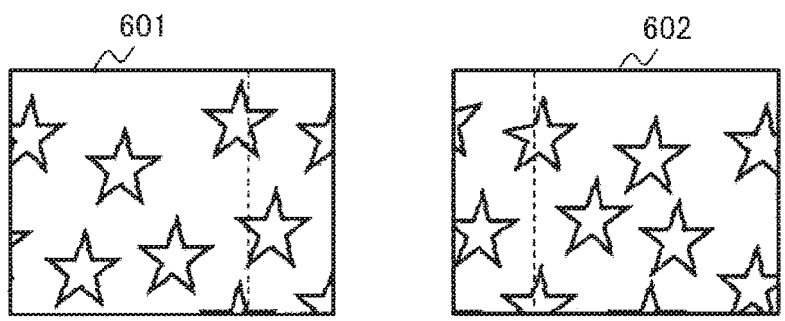
[FIG. 11B]
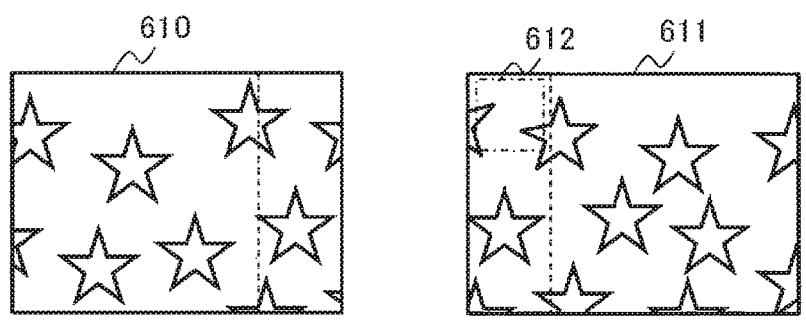

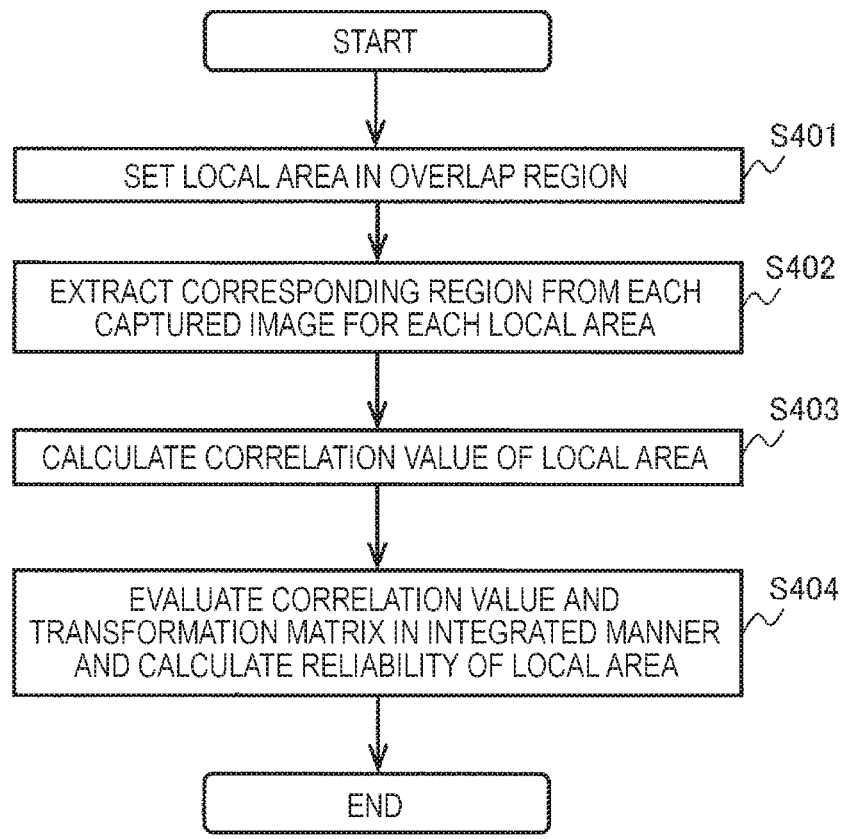
[FIG. 12]

[FIG. 13]
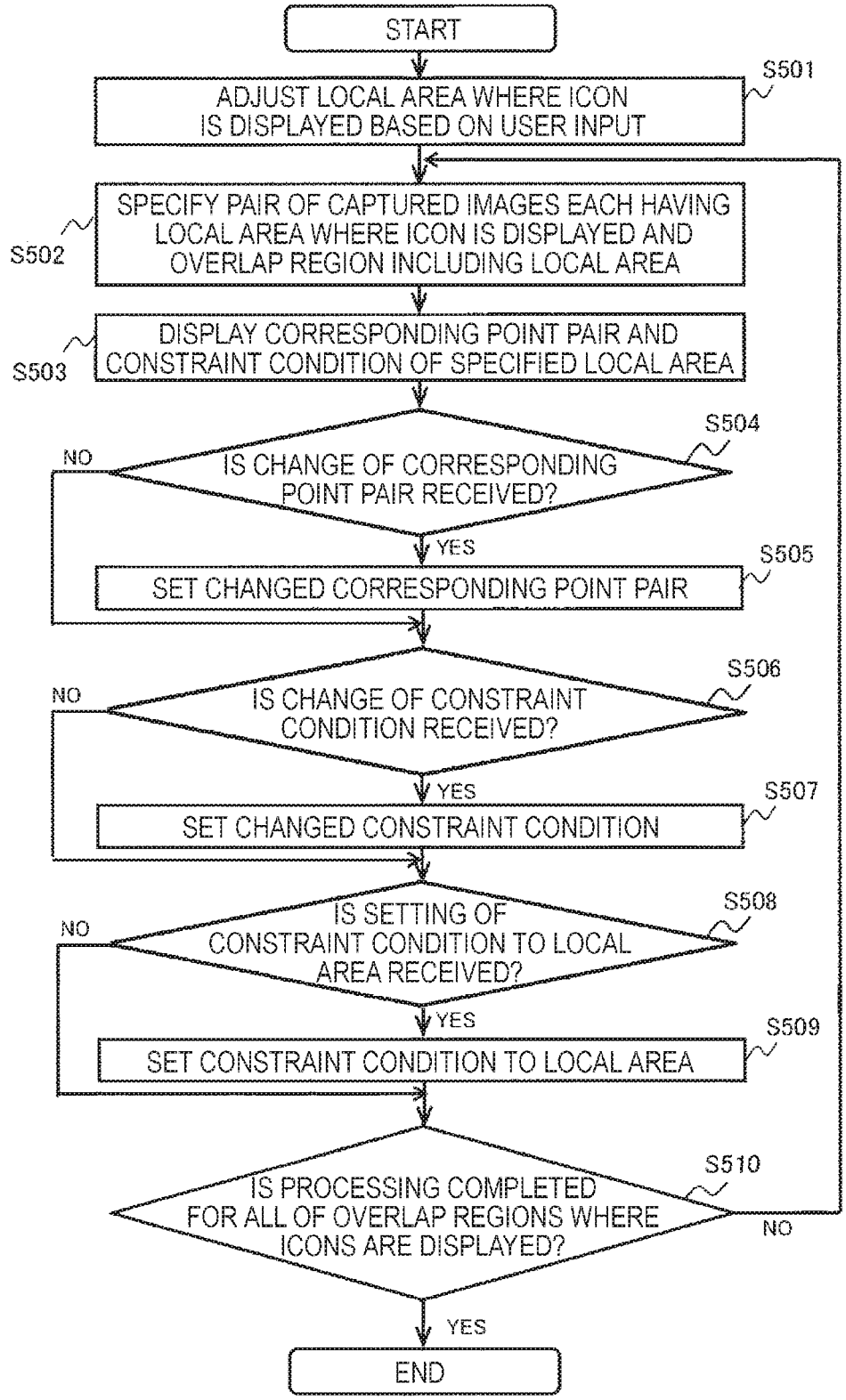

[FIG. 14]
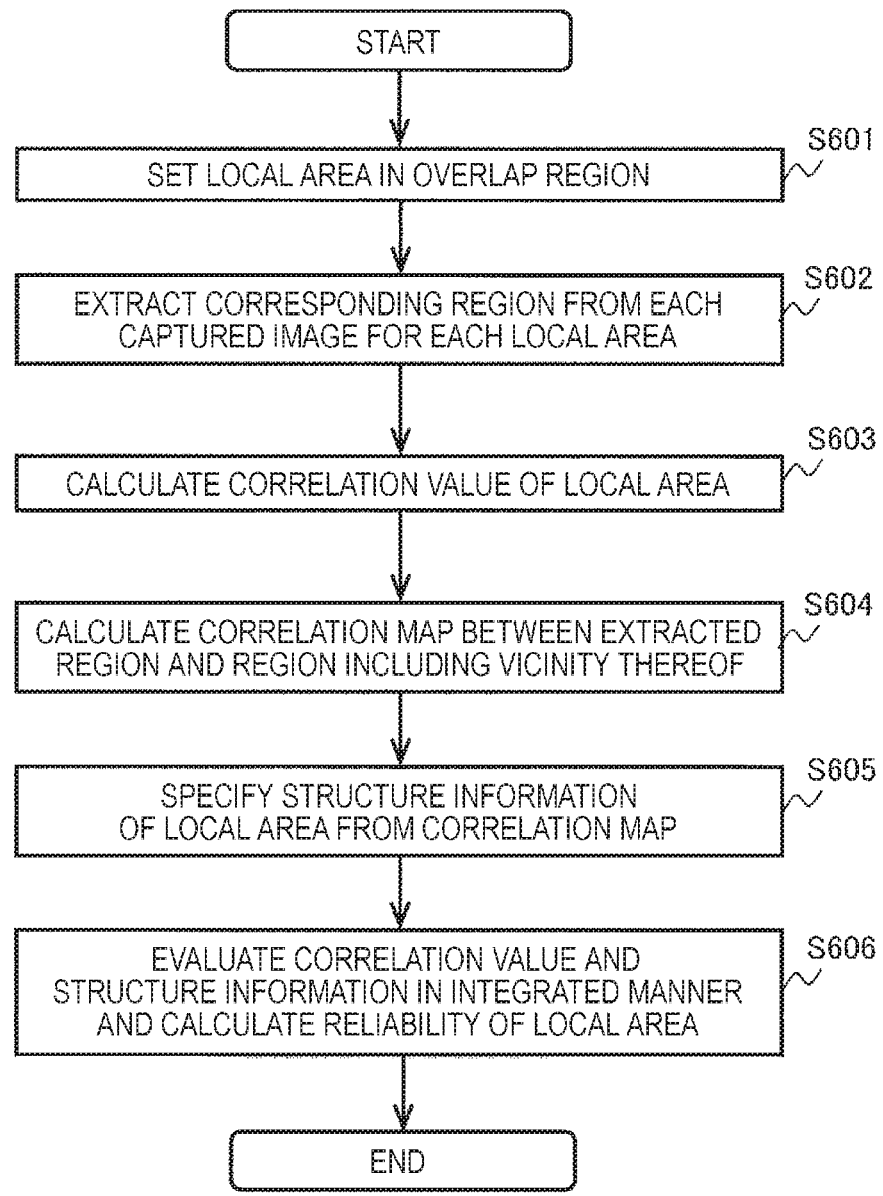

[FIG. 15A]
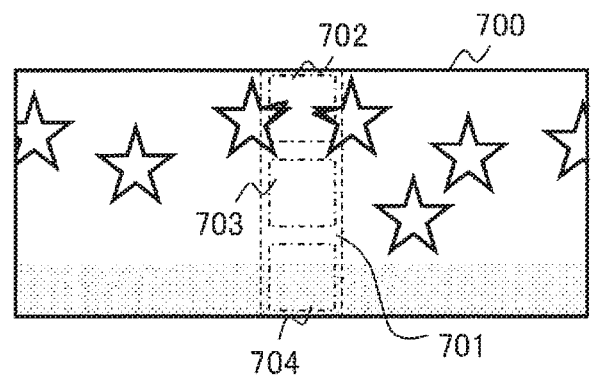
[FIG. 15B]
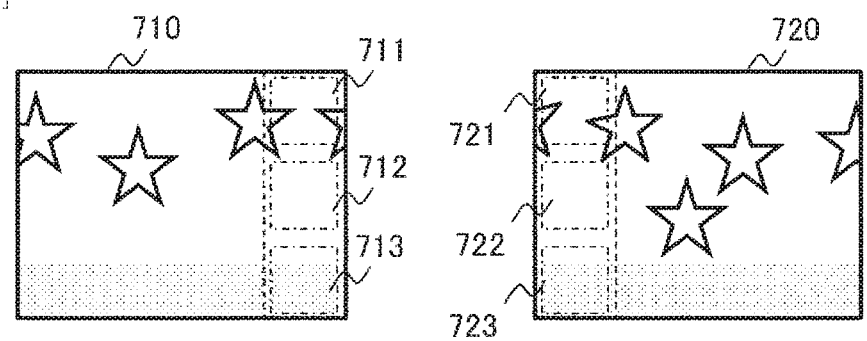
[FIG. 15C]
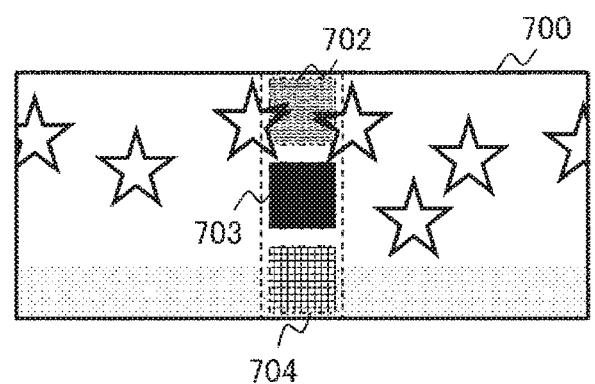

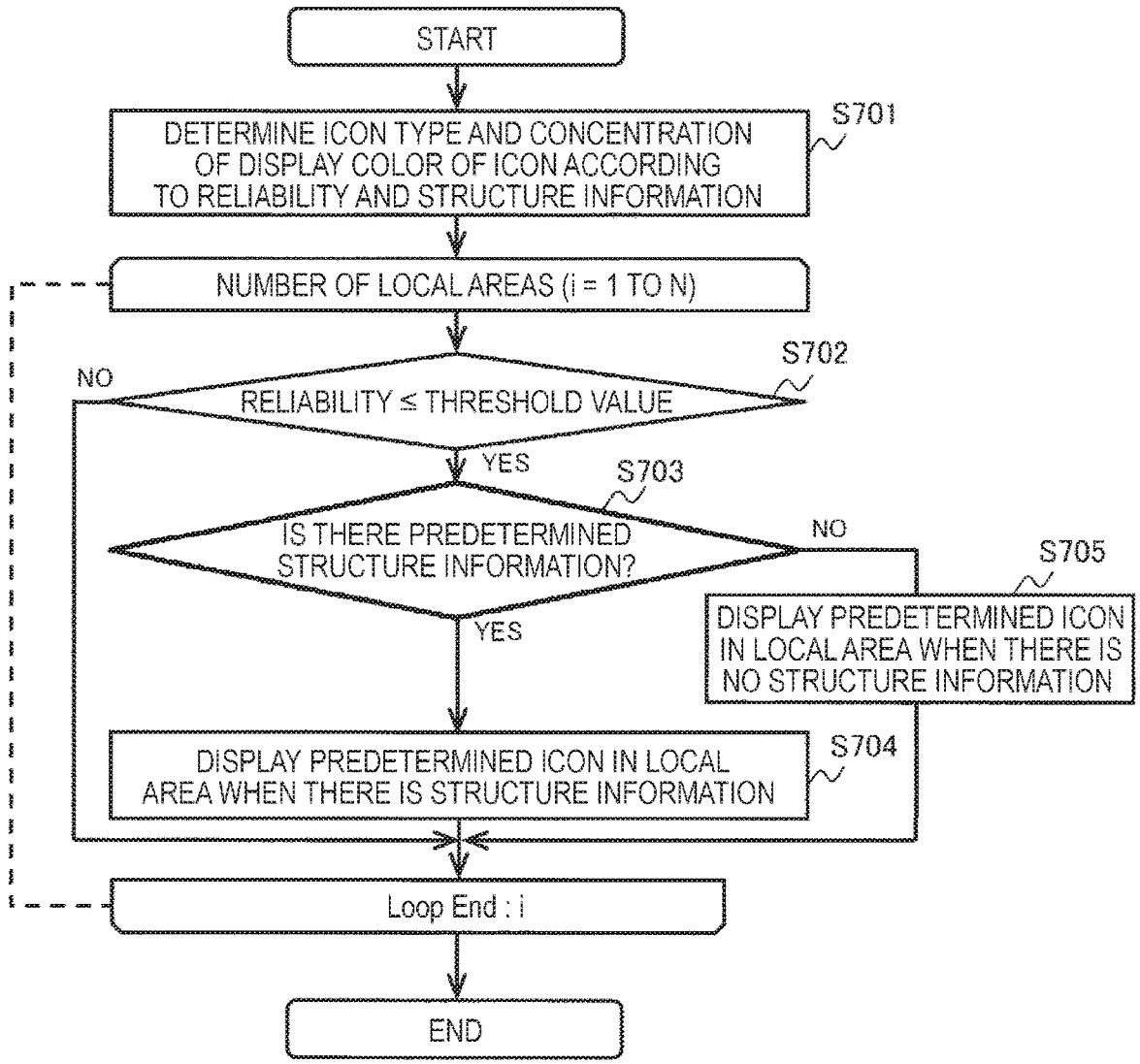
[FIG. 16]

[FIG. 17]
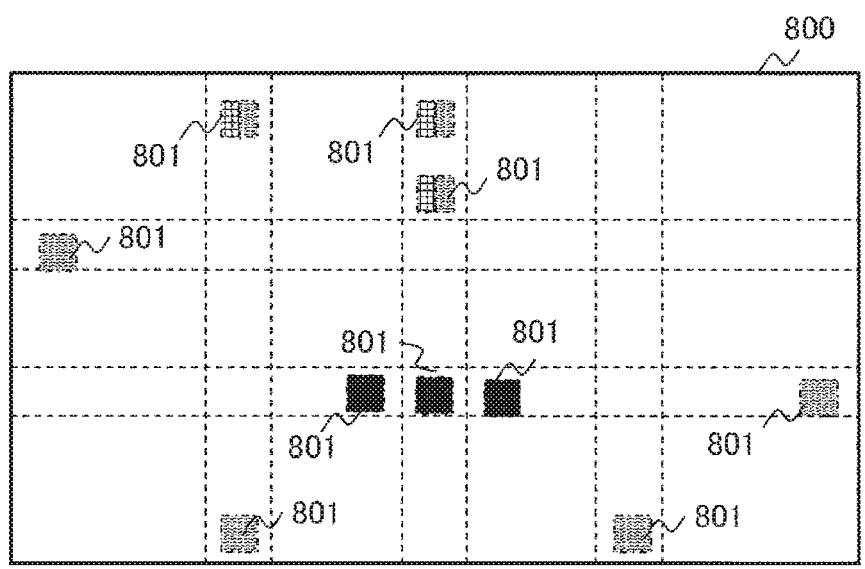

[FIG. 18]
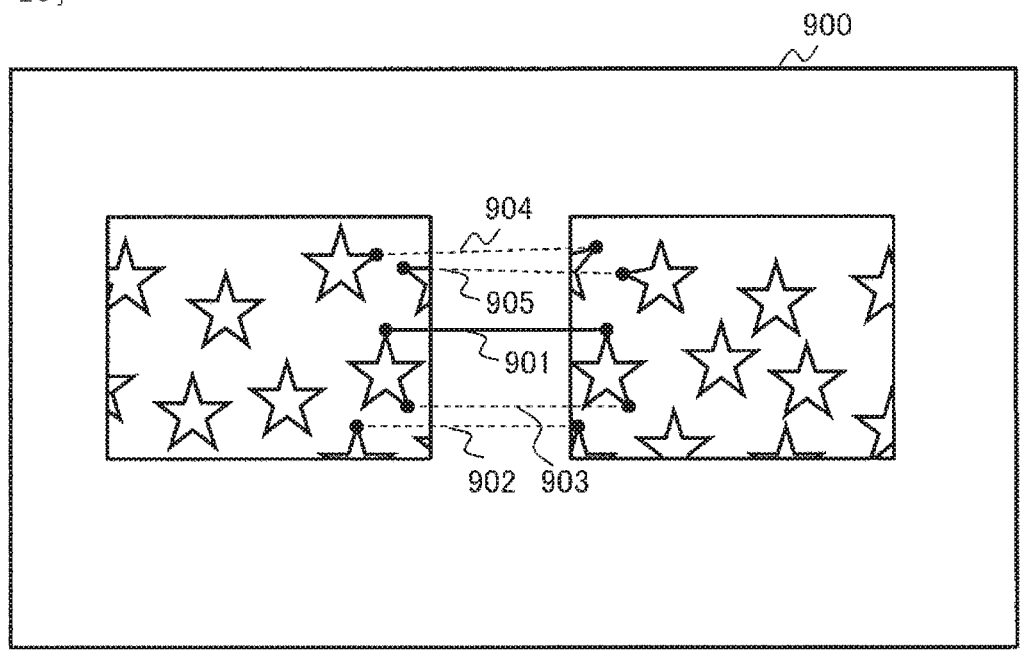

CHARGED PARTICLE MICROSCOPE DEVICE AND WIDE-FIELD IMAGE GENERATION METHOD

TECHNICAL FIELD

The present invention relates to a charged particle microscope device and a wide-field image generation method.

BACKGROUND ART

A charged particle microscope has an extremely high resolution compared to an optical microscope, and is widely used to clearly observe a fine structure of an object to be observed. In the charged particle microscope, an image of a target sample is acquired by irradiating a target sample with a charged particle beam, and by detecting particles (the same type as the irradiated charged particles, different types of charged particles, electromagnetic wave, or photons) reflected by the target sample, emitted from the target sample, or transmitted through the target sample using a detector. There are a wide variety of observation targets for charged particle microscopes, such as targets in the fields of materials, semiconductors, foods, biotechnology, and medicine.

In inspection or analysis using the charged particle microscope, it is necessary to confirm the entire image or distribution of a structure over a wide range, and there is a need to observe a captured image having a wide field of view (hereinafter, referred to as a "wide-field image"). Even in the wide-field image, there is a need for a high-quality image, that is, an image having high resolution, a high SN ratio, and a small misalignment amount between adjacent captured images. However, due to hardware constraint, a range of charged particle beams swayed under high-resolution imaging conditions is narrow, and thus, in a case of imaging a wide field of view, it is necessary to capture an extremely large number of images while moving a stage on which the sample is placed.

In a general wide-field image generation method, first, a wide-field region is captured by moving an imaging position while providing an overlap region, and a plurality of captured images are acquired. Next, a wide-field image is generated by calculating corresponding point pairs between adjacent captured images, by calculating a relative misalignment amount between the captured images based on the corresponding point pairs, and by connecting the captured images to each other. However, since the wide-field image is generated based on the calculated corresponding point pair, there is a problem that the misalignment amount between the captured images in the wide-field image increases in a case where an incorrect corresponding point pair is calculated. As a method for dealing with the problem, PTL 1 below describes a method for receiving an instruction to change a relative position of an overlap region between captured images in a wide-field image once generated, and regenerating the wide-field image based on the received instruction.

Specifically, regarding an information processing method, PTL 1 describes "the storage unit stores a plurality of partial images obtained by capturing a plurality of imaging regions such that the plurality of imaging regions overlap each other on an object, and relative misalignment information of two adjacent partial images calculated for two adjacent partial images among the plurality of partial images. The determination unit determines one or more display partial images for generating a region image for display which is an image of a region displayed as an image of the object from the plurality of stored partial images. The generation unit generates the region image for display by connecting the plurality of partial images for display to each other based on the stored misalignment information in a case where the plurality of partial images for display are determined by the determination unit".

CITATION LIST

Patent Literature

PTL 1: JP-A-2013-058124

SUMMARY OF INVENTION

Technical Problem

However, in the method described in PTL 1, since the relative misalignment amount is corrected with respect to the entire overlap region where the adjacent captured images overlap each other, the misalignment amount of the entire overlap region can be corrected, but there is a problem that it is difficult to accurately correct a misalignment amount of a local area, particularly a misalignment amount of a local area including various image distortions.

The present invention has been made in view of the above problems, and an object of the present invention is to provide a charged particle microscope device that can prompt a user input for correcting local misalignment and regenerate a wide-field image having a small misalignment amount even in a local area of an overlap region based on the user input even in a case where the local misalignment remains in the generated wide-field image.

Solution to Problem

The present application includes a plurality of means for solving at least a part of the above-described problems, but examples of such means are as follows. According to an aspect of the present invention for solving the above-described problem, there is provided a charged particle microscope device including: a charged particle microscope; and an image processing unit, in which the charged particle microscope captures a plurality of captured images in such a way that each captured image has overlap regions in which adjacent captured images overlap each other, in which the image processing unit sets a corresponding point pair for the overlap region between the adjacent captured images, sets predetermined constraint conditions for each captured image, generates one wide-field image by calculating a relative misalignment amount between the captured images based on the corresponding point pair and the constraint conditions, by correcting the relative misalignment between the captured images based on the calculated misalignment amount, and by connecting the captured images to each other, calculates reliability of connection of the captured images in a plurality of local areas set in the overlap regions, and notifies a user of the local area having low reliability or the overlap region including the local area, and the set corresponding point pairs and the constraint conditions.

Advantageous Effects of Invention

According to the charged particle microscope device of the present invention, even in a case where local misalignment remains in the generated wide-field image, it is possible to prompt a user input for correcting the local misalignment and to regenerate a wide-field image having a small misalignment amount even in the local area of the overlap region based on the user input.

BRIEF DESCRIPTION OF DRAWINGS

FIG. 1 is a view illustrating an example of a schematic configuration of a scanning electron microscope device that realizes a charged particle microscope device according to a first embodiment of the present invention.

FIG. 2 is a view illustrating an example of functional blocks of the scanning electron microscope device according to the first embodiment of the present invention.

FIG. 3 is a flowchart illustrating an example of wide-field image generation processing according to the first embodiment of the present invention.

FIG. 4A is a view illustrating an example of a set wide-field region and a wide-field image. FIG. 4B is a view illustrating an example of an imaging region of each captured image that forms the wide-field image of FIG. 4A and an overlap region set for each captured image.

FIG. 5 is a flowchart illustrating details of processing in step S006 according to the first embodiment of the present invention.

FIG. 6A is a view illustrating a part of the wide-field image in which a local area is set. FIG. 6B is a view illustrating a pair of captured images having an overlap region including the local area of FIG. 6A. FIG. 6C is a view illustrating a part of the wide-field image in which an icon is displayed in the local area having low reliability.

FIG. 7 is a flowchart illustrating details of processing in step S007 according to the first embodiment of the present invention.

FIGS. 8A and 8B are simplified views of the wide-field images on which icons indicating that the reliability of connection is low are displayed.

FIG. 9 is a flowchart illustrating details of processing in step S008 according to the first embodiment of the present invention.

FIG. 10A is an example of a GUI screen for receiving a change of a corresponding point pair. FIG. 10B is a view illustrating the changed corresponding point pair.

FIG. 11A is a view illustrating a captured image before applying an optimized transformation matrix. FIG. 11B is a view illustrating a captured image after applying the optimized transformation matrix.

FIG. 12 is a flowchart illustrating details of step S006 performed through step S011 according to the first embodiment of the present invention.

FIG. 13 is a flowchart illustrating details of step S008 performed through step S011 according to the first embodiment of the present invention.

FIG. 14 is a flowchart illustrating details of processing in step S006 according to a second embodiment of the present invention.

FIG. 15A is a view illustrating a part of the wide-field image in which the local area is set. FIG. 15B is a view illustrating a pair of captured images having an overlap region including the local area of FIG. 15A. FIG. 15C is a view illustrating a part of the wide-field image in which icons that reflect reliability and structure information are displayed.

FIG. 16 is a flowchart illustrating details of processing in step S007 according to the second embodiment of the present invention.

FIG. 17 is a simplified view of the wide-field image on which icons that reflect the structure information according to the second embodiment of the present invention are displayed.

FIG. 18 is a view illustrating an example of a GUI in a case where a candidate for a corresponding point pair according to the second embodiment of the present invention is displayed and a change is received.

DESCRIPTION OF EMBODIMENTS

Hereinafter, each embodiment of the present invention will be described with reference to the drawings.

First Embodiment

FIG. 1 is a view illustrating an example of a schematic configuration of a scanning electron microscope device 100 that realizes a charged particle microscope device according to the present embodiment. As illustrated in the drawing, the scanning electron microscope device 100 includes a scanning electron microscope 10, an arithmetic device 20, an input device 30, an output device 40, and a storage device 50.

The scanning electron microscope 10 is a microscope that focuses an electron beam 12 generated by an electron gun 11 on a surface of a sample 15 through a condenser lens 13 and an objective lens 14 and detects secondary electrons or the like emitted from the sample 15 as a detector 16. The scanning electron microscope 10 may include a plurality of detectors, and for example, detectors that detect different types of particles, such as the detector 16 that detects electrons and a detector that detects electromagnetic waves, may be combined with each other. The detector may be a detector that detects only particles of which energy or spin direction is within a specific range. The detector may be a detector that detects particles having different properties, such as a secondary charged particle detector and a backscattered charged particle detector. A plurality of detectors that detect particles having the same properties may be arranged at different positions. In a case where the scanning electron microscope 10 includes the plurality of detectors 16, a plurality of images can be acquired by one imaging.

The scanning electron microscope 10 acquires an image at any position of the sample 15 placed on a stage by moving a stage 17. The scanning electron microscope 10 scans the sample 15 with the electron beam 12 by two-dimensionally changing an orientation of the electron beam (charged particle beam) 12 using a beam deflector 18. The scanning electron microscope 10 captures a plurality of captured images having overlap regions that are regions where adjacent captured images overlap each other.

The arithmetic device 20 is a device that generates the wide-field image using the control of the scanning electron microscope 10 and the captured images captured by the scanning electron microscope 10. Specifically, the arithmetic device 20 controls the scanning electron microscope 10 based on input information, such as imaging conditions received from the user via the input device 30. The arithmetic device 20 generates the wide-field image obtained by connecting the captured image and the captured image of the sample to each other using the information detected by the detector 16.

The arithmetic device 20 includes a central processing unit (CPU) that performs various arithmetic processing, and a memory device, such as a random access memory (RAM) or a read only memory (ROM) that is a main storage device.

The input device 30 is a device that receives an instruction input from a user, such as a touch panel or a numeric keypad. The output device 40 is a device that displays graphics information, such as a display. The storage device 50 is at least a readable/writable storage medium, such as a hard disk drive (HDD) or a nonvolatile memory card.

FIG. 2 is a view illustrating an example of functional blocks of the scanning electron microscope device 100. The scanning electron microscope device 100 includes an arithmetic unit 101 and a storage unit 102. The arithmetic unit 101 includes an input receiving unit 111, an output unit 112, a control unit 113, a processing unit 114, and an image processing unit 115.

The input receiving unit 111 is a functional unit that receives an input of various information. Specifically, the input receiving unit 111 receives an instruction input related to the generation of imaging conditions or generation of a captured image and a wide-field image via the input device 30 from the user.

The output unit 112 is a functional unit that generates screen information that configures a display screen of the output device 40. Specifically, the output unit 112 generates predetermined screen information (for example, wide-field image or predetermined screen information) required to be displayed on the output device 40, and displays the generated predetermined screen information on the output device 40.

The control unit 113 controls the scanning electron microscope 10 and each functional unit. Specifically, the control unit 113 performs predetermined control with respect to a voltage applied to the electron gun 11 of the scanning electron microscope 10, focal positions of the condenser lens 13 and the objective lens 14, a position of the stage 17, and a deflection degree of the beam deflector 18. The control unit 113 controls the functional units such that the input receiving unit 111, the output unit 112, the processing unit 114, and the image processing unit 115 perform each processing at an appropriate timing.

The processing unit 114 is a functional unit that performs various processing of the scanning electron microscope 10. For example, the processing unit 114 performs various processing, such as processing related to automatic focusing necessary for focusing the electron beam 12 on the surface of the sample.

The image processing unit 115 is a functional unit that generates a wide-field image obtained by connecting a captured image and a captured image to each other. As illustrated in the drawing, the image processing unit 115 includes a region setting unit 116, a generation requirement setting unit 117, an optimization unit 118, an image generation unit 119, a reliability calculation unit 120, a reliability display unit 121, and a generation requirement adjustment unit 122.

The region setting unit 116 is a functional unit that sets various regions. Specifically, the region setting unit 116 sets a wide-field region that is the entire region of the wide-field image, an imaging region of the captured image, and an overlap region where adjacent captured images overlap each other.

The generation requirement setting unit 117 is a functional unit that sets corresponding point pairs and constraint conditions which are generation requirements of the wide-field image. Here, the corresponding point pair is, for example, a pair of feature points of which feature amounts are similar to each other between adjacent captured images. The constraint condition is a model of image distortion that is allowed or corrected in a captured image or a local area of the captured image, and is expressed by a transformation matrix for projecting the captured image onto wide-field image coordinates.

The optimization unit 118 is a functional unit that optimizes the transformation matrix for projecting the captured image to the wide-field image coordinates. Specifically, the optimization unit 118 optimizes each component, such as a translation component, a rotation component, a magnification component, and a distortion component of the transformation matrix, an affine transformation matrix, or a nomography transformation matrix.

The image generation unit 119 is a functional unit that generates a captured image and a wide-field image. Specifically, the image generation unit 119 generates a captured image of the target sample 15 using image information acquired from the scanning electron microscope 10. The image generation unit 119 generates a wide-field image using the captured image and the optimized transformation matrix.

The reliability calculation unit 120 is a functional unit that calculates the reliability of connection of captured images. Specifically, the reliability calculation unit 120 sets a predetermined number (for example, three) of local areas in the overlap region, and calculates the reliability of connection of captured images in the local area.

The reliability display unit 121 is a functional unit that visualizes and displays the reliability. Specifically, the reliability display unit 121 displays a predetermined icon in a corresponding local area according to the degree of reliability.

The generation requirement adjustment unit 122 is a functional unit that changes corresponding point pairs and constraint conditions which are generation requirements of a wide-field image. Specifically, the generation requirement adjustment unit 122 displays corresponding point pairs or constraint conditions currently set via the output unit 112 on a graphical user interface (GUI), and receives a change from the user. The generation requirement adjustment unit 122 sets the changed corresponding point pairs and the constraint conditions received from the user via the input receiving unit 111.

The storage unit 102 is a functional unit that stores various information. Specifically, the storage unit 102 stores a captured image 131, a corresponding point pair 132, a constraint condition 133, an optimized transformation matrix 134, and various parameters 135.

Each functional unit included in the arithmetic unit 101 of the scanning electron microscope device 100 is realized by a program that causes the CPU of the arithmetic device 20 to perform processing. The programs are stored in the ROM or the storage device 50, are loaded onto the RAM for execution, and are executed by the CPU. The storage unit 102 may be realized by the RAM or the ROM or storage device 50, and may be realized by the combination thereof.

Each functional block is classified according to the main processing contents in order to facilitate understanding of the function of the scanning electron microscope device 100 according to the present embodiment. Therefore, the present invention is not limited by the classification method of each function or the names of each function. Each configuration of the scanning electron microscope device 100 can also be classified into more configuration elements according to the processing contents. It is also possible to perform classification such that one configuration element executes more processing.

All or part of each functional unit may be constructed by hardware (an integrated circuit, such as an ASIC) mounted on a computer. The processing of each functional unit may be executed by one hardware, or may be executed by a plurality of hardware.

[Description of Operation]

FIG. 3 is a flowchart illustrating an example of wide-field image generation processing executed by the scanning electron microscope device 100. The processing is started when the input receiving unit 111 receives an execution instruction from the user. The imaging conditions, threshold values used in the following processing, and the like are set in advance as parameter information.

When the wide-field image generation processing is started, the region setting unit 116 sets the wide-field region, the imaging region, and the overlap region (step S001). Specifically, the region setting unit 116 receives the input of information that specifies the size of each region from the user via the input receiving unit 111. The region setting unit 116 sets the wide-field region, the imaging region, and the overlap region based on the input information of the user.

FIG. 4A is a view illustrating an example of a set wide-field region 200 and a wide-field image 201. FIG. 4B is a view illustrating an example of imaging regions of each of the captured images 211 to 222 that form the wide-field image 201 of FIG. 4A and overlap regions set for each captured image. The wide-field image 201 illustrated in FIG. 4A is an image generated by overlapping and combining twelve captured images 211 to 222 obtained by capturing the imaging regions illustrated in FIG. 4B in the overlap region. A region defined by a boundary line illustrated by a broken line in FIG. 4B indicates the overlap region. For example, in the captured image 211, a region sandwiched between a boundary line 231 and a right end 232 of the imaging region is an overlap region where the captured image 211 overlaps the captured image 212. In the captured image 211, a region sandwiched between a boundary line 233 and a left end 234 of the imaging region is an overlap region where the captured image 211 overlaps the captured image 215.

The description returns to FIG. 3. Next, the control unit 113 controls the scanning electron microscope 10 and captures the set imaging region (step S002). For example, the control unit 113 acquires a plurality of pieces of image information in the imaging region of the same field of view by controlling the scanning electron microscope 10 to scan the imaging region with the electron beam 12 at high speed. The image generation unit 119 generates the captured image of the imaging region by integrating (averaging) these pieces of image information. The imaging method of the imaging region is not limited thereto, and the control unit 113 may acquire the image information of each imaging region by controlling the scanning electron microscope 10 such that scanning is performed at low speed. Here, the image generation unit 119 generates the captured image of each imaging region using the acquired image information.

The imaging method of the imaging region may be combined with the above-described imaging method, and for example, image processing, such as drift correction, may be combined with the above-described imaging method.

Next, the generation requirement setting unit 117 sets the corresponding point pair and the constraint condition (step S003). Specifically, the generation requirement setting unit 117 sets the corresponding point pair using scale invariant feature transform (SIFT). SIFT is a method for performing feature point extraction and feature amount description of the captured images, calculating the similarity of feature points between the captured images based on a difference amount of the feature amount, and associating the feature points having higher similarity than a predetermined threshold value set by the user as a pair. A plurality of associated pairs may be set as corresponding point pairs as they are, or only a pair having high similarity of the feature amount may be set as a corresponding point pair. The setting of the corresponding point pair is not limited to the above-described method, and other methods may be used.

The generation requirement setting unit 117 sets a constraint condition. The constraint condition is expressed by a transformation matrix for projecting the captured image onto the wide-field image coordinates, and means a misalignment correction amount of the captured image. For example, in a case where it is desired to consider translation, rotation, magnification, and skew distortion as the misalignment correction amount of the captured image, the affine transformation matrix is used as the constraint condition. In a case of considering more complicated image distortion, a nomography transformation matrix is used as a constraint condition. The generation requirement setting unit 117 stores the set corresponding point pair and the constraint condition in the storage unit 102.

In step S003, the generation requirement setting unit 117 sets the translation component of the transformation matrix for each captured image as a constraint condition. The reason why the translation component is set as the constraint condition is that the generation efficiency of the wide-field image is taken into consideration. There is a case where a wide-field image is generated by combining 10,000 captured images. As will be described later, when generating the wide-field image, optimization of the transformation matrix which is a constraint condition is performed, but in a case where the entire affine transformation matrix or the like including other components (for example, rotation component or distortion component) of the transformation matrix is optimized when generating the wide-field image for the first time, the processing takes an enormous amount of time, and the generation efficiency of the wide-field image decreases. Therefore, in the present embodiment, when the wide-field image is generated for the first time, only the translation component of the transformation matrix is set as the constraint condition.

The generation requirement setting unit 117 may set any one of a rotation component, a magnification component, and a distortion component of the transformation matrix.

Next, the optimization unit 118 optimizes the constraint condition set for each captured image, that is, the transformation matrix for projecting the captured image onto the wide-field image coordinates using the corresponding point pair (step S004). Specifically, the optimization unit 118 calculates a square of a distance between points at which each captured image is projected onto the wide-field image using the transformation matrix (for example, translation component) of the captured image to which each of the corresponding point pairs belongs, and sets a value taken from the sum of all of the corresponding point pairs to an objective function. The optimization unit 118 calculates the transformation matrix optimized by minimizing the objective function. As a method for solving the minimum problem of the objective function, for example, the Levenberg-Marquardt method is used.

Next, the image generation unit 119 generates the wide-field image (step S005). Specifically, the image generation unit 119 generates the wide-field image by projecting the captured image onto the wide-field image coordinates using the optimized transformation matrix, by overlapping the overlap regions between the adjacent captured images each other, and by combining the captured images with each other. As a method for combining the captured images, for example, a plurality of captured images may be averaged and combined, or the captured images may be weighted and combined according to the distance from the center of the captured image.

Next, the reliability calculation unit 120 calculates the reliability of connection of the captured images in the local area set in the overlap region (step S006). Here, the reliability is quantification of a possibility of the failure of the connection of the captured images due to the failure of the setting of the corresponding point pairs or the constraint conditions, the image distortion of the captured image, the structure information of the captured image or the like.

FIG. 5 is a flowchart illustrating details of the processing in step S006. In step S101, the reliability calculation unit 120 sets a predetermined number (for example, three) of local areas in the overlap region. The size and quantity of the local area may be received from the user in advance when setting the overlap region, or may be set by the reliability calculation unit 120 according to the size of the overlap region.

FIG. 6A is a view illustrating a part of the wide-field image in which the local area is set. FIG. 6B is a view illustrating a pair of captured images having the overlap region including the local area of FIG. 6A. As illustrated in the drawing, an image 300 in FIG. 6A is an image obtained by averaging and combining the captured images 310 and 320 in FIG. 6B. The reliability calculation unit 120 sets three local areas 304, 305, and 306 for an overlap region 303 sandwiched between the boundaries 301 and 302 of the image 300 by the processing of step S101.

The local area 304 has image distortion. The reason thereof is image distortion that occurs in the region 321 of the captured image 320 that corresponds to the local area 304. The image 300 having the local area 304 is a part of the wide-field image generated using the optimized transformation matrix (in this case, translation component), but the distortion is not eliminated by the transformation matrix, and the star pattern is doubled.

Next, the reliability calculation unit 120 extracts a corresponding region from each captured image for each local area (step S102). Specifically, the reliability calculation unit 120 extracts each of the regions 311 to 313 and the regions 321 to 323 that corresponds to each of the local areas 304 to 306 from the captured images 310 and 320.

Next, the reliability calculation unit 120 calculates the correlation value of the local area (step S103). Specifically, the reliability calculation unit 120 calculates a correlation value for each of the extracted regions 311 and 321, the regions 312 and 322, and the regions 313 and 323. More specifically, the reliability calculation unit 120 calculates each correlation value by setting the correlation value of the regions 311 and 321 that correspond to the local area 304 as a correlation value 1, by setting the correlation value of the regions 312 and 322 that correspond to the local area 305 as a correlation value 2, and by setting the correlation value of the regions 313 and 323 that correspond to the local area 306 as a correlation value 3. Here, since there is image distortion in the region 321, the magnitude relationship of the calculated correlation values 1 to 3 is correlation value 1<correlation value 2≈correlation value 3.

Next, the reliability calculation unit 120 evaluates the correlation value and determines the reliability of the local area (step S104). Specifically, the reliability calculation unit 120 compares the magnitudes of the correlation values, and determines that there is image distortion in the local area 304 that corresponds to the correlation value 1 lower than the other correlation values. The reliability calculation unit 120 performs weighting such that the correlation value 1 is lower than other correlation values. The reliability calculation unit 120 calculates the reliability by multiplying a predetermined coefficient by each correlation value, for example. The reliability calculation unit 120 may perform threshold value processing with respect to the correlation value. The reliability calculation unit 120 may calculate the reliability of the entire overlap region based on the reliability of each local area.

When the reliability calculation unit 120 performs the processing of steps S101 to S104 with respect to all of the overlap regions included in the wide-field image, and the reliability calculation unit 120 ends the flow and proceeds to the processing of step S007.

The description returns to FIG. 3. In step S007, the reliability display unit 121 displays a local area having low reliability of connection of captured images. FIG. 7 is a flowchart illustrating details of the processing in step S007. In step S201, the reliability display unit 121 determines icon type, display color, and display density according to the degree of reliability.

Next, the reliability display unit 121 repeatedly executes the processing of step S202 and step S203 with respect to all of the local areas (for example, identification numbers i=1 to N). In step S202, the reliability display unit 121 determines whether the reliability is equal to or lower than a predetermined threshold value. Such a threshold value may be received from the user in advance, or an average value of reliability in all of the local areas may be used.

In a case where it is determined that the reliability of the local area is not equal to or lower than the predetermined threshold value (No in step S202), the reliability display unit 121 performs the processing of step S202 with respect to the next local area. Meanwhile, in a case where it is determined that the reliability of the corresponding local area is equal to or lower than the predetermined threshold value (Yes in step S202), the reliability display unit 121 displays an icon determined according to the magnitude of the reliability in the corresponding local area (step S203).

FIG. 6C is a view illustrating a part of the wide-field image in which an icon is displayed in the local area having low reliability. As described above, since the local area 304 has image distortion, the reliability is equal to or lower than a predetermined threshold value. Therefore, the reliability display unit 121 displays the icon 330 determined in step S201 with respect to the local area 304.

FIGS. 8A and 8B are simplified views of the wide-field images on which icons indicating that the reliability of connection is low are displayed. As illustrated in the drawing, the processing in steps S201 to S203 causes the local area of the wide-field image 400 in which the reliability of connection is lower than a predetermined threshold value to display icons 401 having a type, color, and darkness that correspond to the degree of reliability. FIG. 8B is a simplified view of the wide-field image that has been determined in step S202 using a threshold value larger than that in FIG. 8A. Therefore, more icons 411 are displayed in the wide-field image 410 in FIG. 8B than in the wide-field image in FIG. 8A.

In a case where the reliability of connection of captured images is calculated with respect to the overlap region, an icon may be displayed in the overlap region where the reliability is lower than a predetermined threshold value.

By such processing, an icon indicating that the reliability is low can be displayed for the local area having low reliability of connection of the captured images. Accordingly, the user can visually grasp a local area having low reliability.

When the reliability display unit 121 performs the processing of step S202 or step S202 and step S203 with respect to all of the local areas, the reliability display unit 121 ends the flow and proceeds to the processing of step S008.

The description returns to FIG. 3. In step S008, the generation requirement adjustment unit 122 receives a change of the corresponding point pair and the constraint condition of the local area having low reliability. FIG. 9 is a flowchart illustrating details of the processing in step S008. In step S301, the generation requirement adjustment unit 122 adjusts the number of local areas with icon display based on a user input. Specifically, the generation requirement adjustment unit 122 receives an increase and decrease in the number of icons to be displayed from the user via the input receiving unit 111.

For example, when receiving an instruction input for increasing the number of icons from the user, the generation requirement adjustment unit 122 sets a predetermined threshold value that is larger than the threshold value used in the determination in step S202. The generation requirement adjustment unit 122 specifies a local area having reliability lower than the set threshold value, and displays a predetermined icon in the local area specified via the output unit 112. Meanwhile, when receiving an instruction input for decreasing the number of icons from the user, the generation requirement adjustment unit 122 sets a predetermined threshold value lower than the threshold value used in the determination in step S202. The generation requirement adjustment unit 122 specifies a local area having reliability lower than the set threshold value, and displays a predetermined icon in the specified local area via the output unit 112.

Accordingly, the user can adjust the number of local areas where icons are displayed. For example, in a case where it is desired to reduce the time for deleting or adding a corresponding point pair, the user can reduce the number of displayed icons. Meanwhile, in a case where it is desired to generate a wide-field image having a small misalignment amount, the user can increase the number of displayed icons.

Next, the generation requirement adjustment unit 122 repeatedly executes the processing of steps S302 to S308 below for all of the overlap regions where the icons are displayed. In step S302, the generation requirement adjustment unit 122 specifies a pair of two adjacent captured images having a local area where an icon is displayed and an overlap region including the local area.

Next, the generation requirement adjustment unit 122 displays the corresponding point pair and the constraint condition of the local area where the icon is displayed (step S303). Specifically, the generation requirement adjustment unit 122 specifies the local area included in the overlap region of the specified captured image. The generation requirement adjustment unit 122 specifies the corresponding point pair set in the specified local area and the constraint condition set for the captured image. The generation requirement adjustment unit 122 displays the specified corresponding point pair and the constraint condition and a part of the wide-field image including the local area on the GUI, and receives a change of the corresponding point pair and the constraint condition from the user via the input receiving unit 111.

Next, the generation requirement adjustment unit 122 determines whether the change of the corresponding point pair has been received (step S304). Specifically, the generation requirement adjustment unit 122 determines whether deletion of an incorrect corresponding point pair or addition of a new corresponding point pair has been received from the user via the input receiving unit 111.

FIG. 10A is an example of a GUI screen for receiving the change of the corresponding point pair. As illustrated in the drawing, on the GUI 500, corresponding point pairs 501 and 502 that receive changes, captured images 503 and 504 in which the corresponding point pairs are set, and a part 505 of the wide-field image obtained by averaging and combining the captured images are displayed. The corresponding point pair 502 is a corresponding point pair that is correctly set, and the corresponding point pair 501 is a corresponding point pair that is set incorrectly.

FIG. 10B is a view illustrating the changed corresponding point pair. The user confirms the corresponding point pair displayed on the GUI 500, and deletes the corresponding point pair 501 set incorrectly via the input device 30. In a case where the corresponding point pair is deleted or in a case where the corresponding point pair is not set in the local area from the beginning, the user adds the correct corresponding point pair 510 on the GUI 500.

In a case where the generation requirement adjustment unit 122 determines that the change of the corresponding point pair has been received (Yes in step S304), the generation requirement adjustment unit 122 sets the changed corresponding point pair (step S305) and proceeds to the processing of step S306. Meanwhile, in a case where it is determined that the change of the corresponding point pair has not been received (No in step S304), the generation requirement adjustment unit 122 proceeds to step S306.

In step S306, the generation requirement adjustment unit 122 determines whether the change of the constraint condition has been received. Specifically, with respect to the pair of captured images specified in step S302, the generation requirement adjustment unit 122 determines whether the change from the currently set transformation matrix (currently, translation component of the transformation matrix) to the affine transformation matrix (including all of the components, such as translation component, rotation component, magnification component, and distortion component of the transformation matrix) or the homography transformation matrix has been received from the user. The generation requirement adjustment unit 122 may receive a change that adds at least one of the rotation component, the magnification component, and the distortion component of the transformation matrix.

In a case of changing the constraint condition, the user changes the constraint condition displayed on the GUI in a text format, for example, via the input device 30 to the affine transformation matrix or the homography transformation matrix.

In a case where the generation requirement adjustment unit 122 determines that the change of the constraint condition has been received (Yes in step S306), the generation requirement adjustment unit 122 sets the changed constraint condition (step S307) and proceeds to the processing of step S308. Meanwhile, in a case where it is determined that the change of the constraint condition has not been received (No in step S306), the generation requirement adjustment unit 122 proceeds to the processing of step S308.

In step S308, the generation requirement adjustment unit 122 determines whether the processing in steps S302 to 307 has been completed with respect to all of the overlap regions where icons are displayed. In a case where it is determined that the processing has not been completed with respect to all of the overlap regions (No in step S308), the generation requirement adjustment unit 122 returns to the processing of step S302, and performs processing with respect to unprocessed overlap regions. Meanwhile, in a case where it is determined that the processing has been completed with respect to all of the overlap regions, the generation requirement adjustment unit 122 ends the flow, and proceeds to the processing of step S009.

The description returns to FIG. 3. In step S009, the image generation unit 119 again optimizes the transformation matrix for projecting the captured image onto the wide-field image. Specifically, the image generation unit 119 optimizes the transformation matrix by the same method as that in step S004, using the changed corresponding point pair and the constraint condition.

Next, the image generation unit 119 temporarily generates and displays the wide-field image (step S010). Specifically, similar to step S005, the image generation unit 119 generates the wide-field image by projecting the captured image onto the wide-field image coordinates using the optimized transformation matrix, by overlapping the overlap regions between the adjacent captured images each other, and by combining the captured images with each other.

FIG. 11A is a view illustrating a captured image before applying the optimized transformation matrix. FIG. 11B is a view illustrating a captured image after applying the optimized transformation matrix. As illustrated in the drawing, the entire captured image is distorted in captured images 601 and 602 before applying the optimized transformation matrix. On the other hand, in the captured images 610 and 611 that are some parts of the wide-field image generated by optimizing the transformation matrix related to the changed constraint condition and using the optimized transformation matrix, the distortion of the entire image is corrected. However, as illustrated in FIG. 11B, it is assumed that, even when the distortion of the entire captured image is corrected using the optimized transformation matrix, the distortion remains in the region 612.

Next, the input receiving unit 111 determines whether an instruction to end the flow has been received from the user (step S011). In a case where it is determined that such an instruction has been received (Yes in step S011), the input receiving unit 111 stores the wide-field image temporarily generated in step S010 in the storage unit 102 (step S012), and ends the flow. Meanwhile, in a case where it is determined that an instruction to end the flow has not been received from the user (No in step S011), the input receiving unit 111 proceeds to the processing of step S006.

In the processing of step S006 performed via step S011, the reliability calculation unit 120 specifies the set constraint conditions. In a case where the translation component of the transformation matrix is set as the constraint condition, the reliability calculation unit 120 calculates the reliability according to the flow of FIG. 5. The processing according to the flow of FIG. 5 is the same as described above, and thus the description thereof will be omitted. Meanwhile, in a case where the affine transformation matrix or the nomography transformation matrix is set as the constraint condition, the reliability calculation unit 120 calculates the reliability according to the flow of FIG. 12.

FIG. 12 is a flowchart illustrating details of step S006 to be performed via step S011. Since the processing in steps S401 to S403 is the same as that in steps S101 to S103 described above, the description thereof will be omitted.

When the correlation value of the local area is calculated in step S403, the reliability calculation unit 120 evaluates the correlation value and the transformation matrix in an integrated manner, and calculates the reliability of the local area (step S404). Specifically, the reliability calculation unit 120 calculates the correction degree of the translation component, the rotation component, the magnification component, and the distortion component of the set transformation matrix (in this case, the affine transformation matrix or the nomography transformation matrix).

More specifically, the reliability calculation unit 120 calculates a difference before and after optimization as the correction degree of the transformation matrix for each component of the transformation matrix optimized in step S009. In a case where the correction degree of each component is larger than a predetermined threshold value, the reliability calculation unit 120 performs weighting for lowering the correlation value of each local area and calculates the reliability of each local area.

Even in a case where the captured images are accurately connected to each other using the optimized transformation matrix, a large correction degree of each component of the transformation matrix means that the captured images are substantially distorted and connected to each other. Since such a captured image is considered not to have excellent characteristics, it is necessary to accurately notify the user of the captured image as a region having a risk. Therefore, the reliability calculation unit 120 performs evaluation such that the reliability is low for a local area where the correction degree of each component of the transformation matrix is large.

When the processing of step S404 is performed with respect to all of the local areas, the reliability calculation unit 120 ends the flow and proceeds to the processing of step S007. Step S007 is the same as described above, and the description thereof will be omitted.

Next, in step S008, the generation requirement adjustment unit 122 again receives the change of the corresponding point pair and the constraint condition of the local area having low reliability. FIG. 13 is a flowchart illustrating details of step S008 to be performed via step S011. Since the processing in steps S501 to S507 is the same as that in steps S301 to S306 described above, the description thereof will be omitted.

In step S508, the generation requirement adjustment unit 122 determines whether the setting of the constraint condition to the local area has been received. For example, as illustrated in FIG. 11B, even when the distortion of the entire captured image is corrected using the optimized transformation matrix, there is a case where the local distortion remains as illustrated in the region 612. In such a case, the user sets the constraint condition (for example, the affine transformation matrix or the homography transformation matrix) for the local area with distortion on the GUI. The generation requirement adjustment unit 122 may receive the user input for setting at least one of the rotation component, the magnification component, and the distortion component of the transformation matrix, in the local area.

In this manner, by setting the constraint condition in the local area, for example, it becomes possible to correct the local distortion and the misalignment that could not be corrected even by the correct corresponding point pair, the affine transformation matrix, or the homography transformation matrix.

In a case where it is determined that the setting of the constraint condition to the local area has been received (Yes in step S508), the generation requirement adjustment unit 122 sets the constraint condition to the local area (step S509) and proceeds to the processing of step S510. Meanwhile, in a case where it is determined that the setting of the constraint condition to the local area has not been received (No in step S508), the generation requirement adjustment unit 122 proceeds to the processing of step S510.

In step S510, the generation requirement adjustment unit 122 determines whether the processing in steps S502 to 509 has been completed with respect to all of the overlap regions where icons are displayed. In a case where it is determined that the processing has not been completed with respect to all of the overlap regions (No in step S510), the generation requirement adjustment unit 122 returns to the processing of step S502, and performs similar processing with respect to unprocessed overlap regions. Meanwhile, in a case where it is determined that the processing has been completed with respect to all of the overlap regions, the generation requirement adjustment unit 122 ends the flow, and proceeds to the processing of step S009.

The description returns to FIG. 3. In step S009, similar to the description above, the image generation unit 119 again optimizes the transformation matrix for projecting the captured image onto the wide-field image. Specifically, the image generation unit 119 optimizes the transformation matrix by the same method as that in step S004, using the changed corresponding point pair and the constraint condition. In a case where the constraint condition is set in the local area in step S509, the transformation matrix is optimized by incorporating the constraint condition as a variable of the objective function.

Similar to the description above, the image generation unit 119 temporarily generates and displays the wide-field image (step S010). The input receiving unit 111 determines whether the instruction to end the flow has been received (step S011). In a case where it is determined that the end instruction has not been received (No in step S011), the input receiving unit 111 moves the processing of step S006. Meanwhile, in a case where it is determined that the end instruction has been received (Yes in step S011), the input receiving unit 111 stores the wide-field image temporarily generated in step S010 in the storage unit 102 (step S012), and ends the flow.

The wide-field image generation processing according to the present embodiment has been described above. According to the charged particle microscope device, even in a case where local misalignment remains in the generated wide-field image, it is possible to prompt a user input for correcting the local misalignment and to regenerate a wide-field image having a small misalignment amount even in the local area of the overlap region based on the user input.

Second Embodiment

Next, a second embodiment of the present invention will be described. The charged particle microscope device according to the present embodiment calculates the reliability of connection of the captured images in the local area using the structure information of the captured images and notifies the user of the calculated reliability by icon display. The same configuration and processing as those of the first embodiment will be given the same reference numerals, and the description thereof will be omitted.

The scanning electron microscope device 100 executes the wide-field image generation processing illustrated in FIG. 3. Since the processing in steps S001 to S005 and steps S008 to S011 is the same as that in the first embodiment, the description thereof will be omitted.

FIG. 14 is a flowchart illustrating details of processing in step S006 according to a second embodiment of the present invention. Since steps S601 and S602 are the same as steps S101 and S102 described above, the description thereof will be omitted. In step S603, similar to step S103 described above, the reliability calculation unit 120 calculates the correlation value of the local area. In step S604, the reliability calculation unit 120 calculates a correlation map between the region extracted in step S602 and the region including the vicinity thereof. Hereinafter, calculation of the correlation value and the correlation map will be described with reference to FIGS. 15A, 15B, and 15C.

FIG. 15A is a view illustrating a part of the wide-field image in which the local area is set. FIG. 15B is a view illustrating a pair of the captured images having the overlap region including the local area of FIG. 15A. As illustrated in the drawing, an image 700 in FIG. 15A is an image obtained by averaging and combining captured images 710 and 720 in FIG. 15B. In the overlap region 701, three local areas 702, 703, and 704 are set.

The reliability calculation unit 120 extracts regions 711 and 721, regions 712 and 722, and regions 713 and 723 as regions that correspond to the local areas 702, 703, and 704, respectively, from the captured images 710 and 720. The reliability calculation unit 120 calculates the correlation value between the extracted regions 711 and 721, the regions 712 and 722, and the regions 713 and 723.

Here, the region 721 that corresponds to the local area 702 has image distortion, and the star pattern is doubled in the local area 702. The regions 712 and 722 that correspond to the local area 703 have no pattern. The regions 713 and 723 that correspond to the local area 704 have a repetitive pattern. Therefore, in a case where the correlation value of the regions 711 and 721 is the correlation value 1, the correlation value of the regions 712 and 722 is the correlation value 2, and the correlation value of the regions 713 and 723 is the correlation value 3, the magnitude relationship of the correlation values 1 to 3 is correlation value 1>correlation value 2<correlation value 3.

With respect to the regions 711 and 721, the regions 712 and 722, and the regions 713 and 723, the reliability calculation unit 120 calculates a correlation map between the regions including the vicinity thereof. Since there is no pattern in the regions 712 and 722, a correlation map in which no high peak appears is calculated. Since there are repetitive patterns in the regions 713 and 723, a correlation map in which a plurality of high peaks appear is calculated.

The description returns to FIG. 14. In step S605, the reliability calculation unit 120 specifies structure information (for example, a pattern or the like) of the local area using the correlation map. Specifically, the reliability calculation unit 120 specifies that the local area 703 that corresponds to the regions 712 and 722 where no high peak appears in the correlation map has no pattern. The reliability calculation unit 120 specifies that a repetitive pattern exists in the local area 704 that corresponds to the regions 713 and 723 where a plurality of high peaks appear in the correlation map.

Next, the reliability calculation unit 120 determines the reliability of the local area by comprehensively evaluating the correlation value and the structure information (step S606). Specifically, the reliability calculation unit 120 performs weighting for lowering the correlation value of the local area having structure information, such as a pattern that makes it difficult to extract the corresponding point pairs, that is, "no pattern" or "repetitive pattern", and calculates the weighted correlation value as the reliability of each local area. When calculating the reliability, the reliability calculation unit 120 proceeds to the processing of step S007.

The description returns to FIG. 3. In step S007, the reliability display unit 121 displays a local area having low reliability of connection of captured images. FIG. 16 is a flowchart illustrating details of processing in step S007 according to the second embodiment. In step S701, the reliability display unit 121 sets the icons of the local area according to the reliability and the structure information. Specifically, the reliability display unit 121 determines the icon type and the display color (single color, gradation, and the like) of the icon according to the reliability and the presence of structure information.

Next, the reliability display unit 121 repeatedly executes the processing of step S702 to step S705 with respect to all of the local areas (for example, i=1 to N). In step S702, the reliability display unit 121 determines whether the reliability is equal to or lower than a predetermined threshold value.

In a case where it is determined that the reliability of the local area is not equal to or lower than the predetermined threshold value (No in step S702), the reliability display unit 121 performs the processing of step S702 with respect to the next local area. Meanwhile, in a case where it is determined that the reliability of the corresponding local area is equal to or lower than the predetermined threshold value (Yes in step S702), the reliability display unit 121 determines whether there is the predetermined structure information (for example, "no pattern", "repetitive pattern", and the like) received from the user in advance in the local area (step S703).

In a case where it is determined that there is the predetermined structure information in the local area (Yes in step S703), the reliability display unit 121 displays an icon in the local area in a case where there is structure information determined in step S701 (step S704). Meanwhile, in a case where it is determined that there is no predetermined structure information in the local area (No in step S703), the reliability display unit 121 displays a predetermined icon in a case where there is no structure information in the local area (step S705).

FIG. 15C is a view illustrating a part of the wide-field image in which an icon that reflects the reliability and the structure information is displayed. In the local areas 702, 703, and 704, icons determined based on the reliability and the structure information are displayed. The icon of the local area 703 is an icon that reflects the structure information "no pattern". The icon of the local area 704 is an icon that reflects the structure "repetitive pattern". FIG. 17 is a simplified view of the wide-field image on which the icon that reflects the structure information is displayed. In a wide-field image 800, an icon 801 of a type that corresponds to the structure information of the local area is displayed.

Through the processing above, the structure information of the local area having low reliability of connection of the captured images can be displayed as an icon, and thus, it is possible to visually notify the user of the structure information of the local area that is the cause of the low reliability of connection.

The present invention is not limited to the above-described embodiments, and for example, in step S008, the user may select a local area or a captured image for changing the corresponding point pair and the constraint condition.

Accordingly, since the user does not need to consider the change of the corresponding point pair or the constraint condition for all of the local areas where the icons are displayed, it is possible to reduce the time spent on the change work.

As a modification example of the above-described embodiment, a candidate for the corresponding point pair to be added may be displayed when the change of corresponding point pair is received in step S008. FIG. 18 is a view illustrating an example of a GUI in a case where the candidate for the corresponding point pair is displayed and a change is received. As illustrated in the drawing, on a GUI 900, corresponding point pair 901 set in step S003 and corresponding point pairs 902, 903, 904, and 905 that are candidates to be added are displayed. For example, the generation requirement adjustment unit 122 extracts a corresponding point pair that is a candidate when the corresponding point pair is set in step S003, and displays the extracted corresponding point pair on the GUI 900 via the output unit 112.

The generation requirement adjustment unit 122 may display a region candidate to which a constraint condition is added when receiving the change of the constraint condition in step S008. The generation requirement adjustment unit 122 extracts a predetermined number (for example, 1 to 2) of local areas from the local areas set in step S006 in ascending order of reliability, and displays the extracted local areas on the GUI 900 via the output unit 112.

Accordingly, since the candidate of the corresponding point pair to be added and the candidate region to which the constraint condition is added are displayed, the user can visually confirm the candidate region of the corresponding point pair or the constraint condition to be added, and efficiently perform an operation for addition.

As a modification example of the above-described embodiment, the processing in steps S006 to S011 may be repeated without receiving the user input. For example, the corresponding point pair which is a candidate when setting the corresponding point pair in step S003 is stored in the storage unit 102. When changing the corresponding point pair related to the local area having low reliability in step S008, the generation requirement adjustment unit 122 extracts the candidate for the corresponding point pair having high similarity of feature amount next to the current corresponding point pair from the storage unit 102 without receiving the user input. The generation requirement adjustment unit 122 sets the candidate for the extracted corresponding point pair as a new corresponding point pair. Through the step S011, the processing in steps S006 to S011 described above is repeated until there is no candidate for the corresponding point pair or the reliability of all of the local areas becomes equal to or higher than the threshold value.

Accordingly, by changing the corresponding point pair without any user input in the overlap region including the valid corresponding point pair among the candidates for the corresponding point pair, it is possible to shorten the time spent by the user to change the corresponding point pair.

The present invention is not limited to the above-described examples, and includes various modification examples. For example, the above-described examples are examples which are described in detail in order to make it easy to understand the present invention, and are not limited to a case where all of the described configurations are necessarily provided. Apart of the configuration of a certain example can be replaced with the configuration of other examples, and the configuration of the other example can be added to the configuration of a certain example. It is also possible to add, remove, or replace other configurations with a part of the configuration of each example.

In the description above, control lines or information lines indicate what is considered necessary for the description, and not all the control lines or information lines on the product are necessarily illustrated. In practice, it can be considered that almost all the configurations are connected to each other.

REFERENCE SIGNS LIST

100: scanning electron microscope device (charged particle microscope device)
10: scanning electron microscope
20: arithmetic device
30: input device
40: output device
50: storage device
101: arithmetic unit
102: storage unit
111: input receiving unit
112: output unit
113: control unit
114: processing unit
115: image processing unit
116: region setting unit
117: generation requirement setting unit
118: optimization unit
119: image generation unit
120: reliability calculation unit
121: reliability display unit
122: generation requirement adjustment unit
131: captured image
132: corresponding point pair
133: constraint condition
134: optimized transformation matrix
135: various parameters

The invention claimed is:

1. A charged particle microscope device comprising:
a charged particle microscope; and
an image processing unit, wherein
the image processing unit is implemented using a processor,
the charged particle microscope captures a plurality of captured images in such a way that each captured image has overlap regions in which adjacent captured images overlap each other,
the image processing unit
sets a corresponding point pair for the overlap region between the adjacent captured images,
sets predetermined constraint conditions for each captured image,
generates one wide-field image by calculating a relative misalignment amount between the captured images based on the corresponding point pair and the constraint conditions, by correcting the relative misalignment between the captured images based on the calculated misalignment amount, and by connecting the captured images to each other,
calculates reliability of connection of the captured images in a plurality of local areas set in the overlap regions,
notifies a user of the local area having low reliability or the overlap region including the local area, and the set corresponding point pairs and the constraint conditions,
receives from a user a change of one or more corresponding point pairs and constraint conditions among the set corresponding point pairs and the constraint conditions based on a display of the reliability,
sets the corresponding point pairs and the constraint conditions which are changed, and
generates one wide-field image by calculating the relative misalignment amount between the captured images based on the changed corresponding point pairs and the constraint conditions, by correcting the relative misalignment between the captured images based on the calculated misalignment amount, and by connecting the captured images.

2. The charged particle microscope device according to claim 1, wherein
the image processing unit
recalculates the reliability of connection of the captured images in the local area set in the overlap region of the wide-field image generated based on the changed corresponding point pairs and the constraint conditions, and
notifies the user of the local area having the recalculated low reliability or the overlap region including the local area, and the set corresponding point pairs and the constraint conditions.

3. The charged particle microscope device according to claim 1, wherein
the image processing unit calculates the reliability based on at least one of magnification, rotation, and distortion correction degree of the corrected captured image.

4. The charged particle microscope device according to claim 1, further comprising:
the image processing unit displays the screen information for receiving by which the user deletes the set corresponding point pairs and the constraint conditions or that the user adds a new corresponding point pair and constraint condition.

5. The charged particle microscope device according to claim 4, wherein
the image processing unit receives, from the user, addition of at least one of magnification, rotation, and distortion degree with respect to the captured image as a change in the constraint condition.

6. The charged particle microscope device according to claim 4, wherein
the image processing unit displays the corresponding point pairs that are candidates for new corresponding point pairs to be added by the user.

7. The charged particle microscope device according to claim 1, wherein
the image processing unit specifies structure information of the local area and calculates the reliability based on the specified structure information.

8. The charged particle microscope device according to claim 1, wherein
the image processing unit displays factors having low reliability.

9. The charged particle microscope device according to claim 8, wherein
the image processing unit makes contents to be displayed different based on the reliability and the factors of low reliability.

10. A wide-field image generation method using a charged particle microscope device, the method comprising:
a step of capturing a plurality of captured images in such a way that each captured image has overlap regions in which adjacent captured images overlap each other,
a step of setting a corresponding point pair for the overlap region between the adjacent captured images,
a step of setting predetermined constraint conditions for each captured image,
a step of generating one wide-field image by calculating a relative misalignment amount between the captured images based on the corresponding point pair and the constraint conditions, by correcting the relative misalignment between the captured images based on the calculated misalignment amount, and by connecting the captured images to each other, a step of calculating reliability of connection of the captured images in a plurality of local areas set in the overlap regions, a step of notifying a user of the local area having low reliability or the overlap region including the local area, and the set corresponding point pairs and the constraint conditions, a step of receiving a change of one or more corresponding point pairs and constraint conditions among the set corresponding point pairs and the constraint conditions based on a display of the reliability, a step of setting the corresponding point pairs and the constraint conditions which are changed, and a step of generating one wide-field image by calculating a relative misalignment amount between the captured images based on the changed corresponding point pairs and the constraint conditions, by correcting the relative misalignment between the captured images based on the calculated misalignment amount, and by connecting the captured images to each other.

11. The wide-field image generation method according to claim 10, further comprising:

a step of recalculating the reliability of connection of the captured images in the local area set in the overlap region of the wide-field image generated based on the changed corresponding point pairs and the constraint conditions, and notifying the user of the local area having the recalculated low reliability or the overlap region including the local area, and the set corresponding point pairs and the constraint conditions.

12. The wide-field image generation method according to claim 10, further comprising:

a step of calculating the reliability based on at least one of magnification, rotation, and distortion correction degree of the corrected captured image.

13. The wide-field image generation method according to claim 10, further comprising:

displaying screen information for receiving by which the user deletes the set corresponding point pairs and the constraint conditions or that the user adds a new corresponding point pair and constraint condition; and displaying the corresponding point pairs that are candidates for new corresponding point pairs to be added by the user.

14. The wide-field image generation method according to claim 10, further comprising:

specifying structure information of the local area and calculating the reliability based on the specified structure information;

displaying factors having low reliability; and making contents to be displayed different based on the reliability and the factors of low reliability.

15. A non-transitory computer-readable medium upon which is embodied programmed instructions which, when executed by a processor, cause the processor to perform wide-field image generation operations using a charged particle microscope device, the operations comprising:

capturing a plurality of captured images in such a way that each captured image has overlap regions in which adjacent captured images overlap each other;

setting a corresponding point pair for the overlap region between the adjacent captured images;

setting predetermined constraint conditions for each captured image;

generating one wide-field image by calculating a relative misalignment amount between the captured images based on the corresponding point pair and the constraint conditions, by correcting the relative misalignment between the captured images based on the calculated misalignment amount, and by connecting the captured images to each other;

calculating reliability of connection of the captured images in a plurality of local areas set in the overlap regions;

notifying a user of the local area having low reliability or the overlap region including the local area, and the set corresponding point pairs and the constraint conditions;

receiving a change of one or more corresponding point pairs and constraint conditions among the set corresponding point pairs and the constraint conditions based on a display of the reliability;

setting the corresponding point pairs and the constraint conditions which are changed; and generating one wide-field image by calculating a relative misalignment amount between the captured images based on the changed corresponding point pairs and the constraint conditions, by correcting the relative misalignment between the captured images based on the calculated misalignment amount, and by connecting the captured images to each other.

16. The non-transitory computer-readable medium according to claim 15, wherein the operations further comprise:

recalculating the reliability of connection of the captured images in the local area set in the overlap region of the wide-field image generated based on the changed corresponding point pairs and the constraint conditions, and notifying the user of the local area having the recalculated low reliability or the overlap region including the local area, and the set corresponding point pairs and the constraint conditions.

17. The non-transitory computer-readable medium according to claim 15, wherein the operations further comprise:

calculating the reliability based on at least one of magnification, rotation, and distortion correction degree of the corrected captured image.

18. The non-transitory computer-readable medium according to claim 15, wherein the operations further comprise:

displaying screen information for receiving by which the user deletes the set corresponding point pairs and the constraint conditions or that the user adds a new corresponding point pair and constraint condition;

displaying the corresponding point pairs that are candidates for new corresponding point pairs to be added by the user.

19. The non-transitory computer-readable medium according to claim 15, wherein the operations further comprise:

receiving, from the user, addition of at least one of magnification, rotation, and distortion degree with respect to the captured image as a change in the constraint condition.

20. The non-transitory computer-readable medium according to claim 15, wherein the operations further comprise:

specifying structure information of the local area and calculating the reliability based on the specified structure information;

displaying factors having low reliability; and
making contents to be displayed different based on the reliability and the factors of low reliability.

\* \* \* \* \*

UNITED STATES PATENT AND TRADEMARK OFFICE
CERTIFICATE OF CORRECTION

PATENT NO.         : 11,508,047 B2
APPLICATION NO.    : 16/639701
DATED              : November 22, 2022
INVENTOR(S)        : Mitsutoshi Kobayashi et al.

It is certified that error appears in the above-identified patent and that said Letters Patent is hereby corrected as shown below:

In the Claims

Claim 4, at Column 20, Line 24:
Please change "the screen information" to -- screen information --.

Signed and Sealed this
Twenty-fifth Day of April, 2023

Katherine Kelly Vidal
*Director of the United States Patent and Trademark Office*